US012613288B2

(12) United States Patent

Izawa et al.

(10) Patent No.: US 12,613,288 B2

(45) Date of Patent: Apr. 28, 2026

(54) VOLTAGE DETECTION DEVICE AND BATTERY MODULE

(71) Applicant: AESC Japan Ltd., Kanagawa (JP)

(72) Inventors: Takami Izawa, Kanagawa (JP); Masayuki Nakai, Kanagawa (JP); Yasuhiro Yanagihara, Kanagawa (JP); Ryuichi Amagai, Kanagawa (JP); Liping Cui, Kanagawa (JP)

(73) Assignee: AESC JAPAN LTD., Kanagawa (JP)

( * ) Notice: Subject to any disclaimer, the term of this patent is extended or adjusted under 35 U.S.C. 154(b) by 104 days.

(21) Appl. No.: 18/261,191

(22) PCT Filed: Jan. 12, 2022

(86) PCT No.: PCT/JP2022/000706

§ 371 (c)(1),
(2) Date: Jul. 12, 2023

(87) PCT Pub. No.: WO2022/154008

PCT Pub. Date: Jul. 21, 2022

(65) Prior Publication Data

US 2024/0069119 A1 Feb. 29, 2024

(30) Foreign Application Priority Data

Jan. 15, 2021 (JP) ................................. 2021-004740

(51) Int. Cl.
*G01R 31/396* (2019.01)
*G01R 31/3835* (2019.01)

(52) U.S. Cl.
CPC ....... *G01R 31/396* (2019.01); *G01R 31/3835* (2019.01)

(58) Field of Classification Search
CPC ............. G01R 31/396; G01R 31/3835; H01M 10/482; H01M 50/204; H01M 50/548; H01M 50/557; H01M 50/569; Y02E 60/10
See application file for complete search history.

(56) References Cited

U.S. PATENT DOCUMENTS 8,329,324 B2 * 12/2012 Lee ...................... H01M 50/296
429/170
8,691,409 B2 * 4/2014 Shin .................... H01M 10/482
429/61

(Continued)

FOREIGN PATENT DOCUMENTS

CN 209822766 U 12/2019
EP 3696878 A1 8/2020

(Continued)

OTHER PUBLICATIONS

BNH/BN Series Terminal Blocks, Idec BN BNH Catalog, 2019, available at https://us.idec.com/idec-us/en/USD/medias/BN-BNHSeries.pdfcontext=bWFzdGVyfGRvY3VtZW50c3wxNDY5MzgzfGFwcGxpY2F0aW9uL3BkZnxkb2N1bWVudHMvaGl4L2gzZS84OTI5Nj U4OTYxOTUwLnBkZnwyZDAwNjlyYjExN2E4MGJINzQ3NDQ1NTJhNWJkNWYzYjU1YTYxYmY5NWM4NWY5N (Year: 2019).*

*Primary Examiner* — Daniel R Miller

(74) *Attorney, Agent, or Firm* — Rankin, Hill & Clark LLP

(57) ABSTRACT

A first voltage detection device (30) detects a voltage of a lead portion (150) folded back between different battery cells (100). The first voltage detection device (30) includes a first voltage detection portion (410), a first voltage detection line (420) electrically connected to the first voltage detection portion (410), and a first holding body (300) holding the first voltage detection portion (410) and the first voltage detection line (420).

8 Claims, 16 Drawing Sheets

(56)     References Cited

U.S. PATENT DOCUMENTS

| 2011/0195285 | A1 | 8/2011 | Shin et al. |
| 2015/0380779 | A1 | 12/2015 | Kong et al. |

FOREIGN PATENT DOCUMENTS

| JP | 2006-294338 | A | 10/2006 |
| JP | 2013-235827 | A | 11/2013 |
| JP | 2016-115601 | A | 6/2016 |
| JP | 2017-531304 | A | 10/2017 |
| JP | 2018-152223 | A | 9/2018 |
| JP | 2020-524375 | A | 8/2020 |
| KR | 10-2012-0108260 | A | 10/2012 |

* cited by examiner

VOLTAGE DETECTION DEVICE AND BATTERY MODULE

TECHNICAL FIELD

The present invention relates to a voltage detection device and a battery module.

BACKGROUND ART

A battery module such as a lithium-ion secondary battery includes a plurality of stacked battery cells. In such a battery module, a plurality of battery cells are electrically connected to each other by a positive electrode lead and a negative electrode lead drawn from the battery cell. A plurality of parallel-connected battery cells may be connected in series with a plurality of other parallel-connected battery cells.

Patent Document 1 describes one example of a battery module. In this example, a positive electrode lead and a negative electrode lead of each battery cell are electrically connected through a bus bar.

Patent Document 2 describes one example of a method of manufacturing a battery module. In this example, a positive electrode lead of a single battery cell and a negative electrode lead of another single battery cell are bonded by ultrasonic bonding. A lead portion is folded back between different battery cells.

RELATED DOCUMENT

Patent Document

Patent Document 1: Japanese Patent Application Publication (Translation of PCT Application) No. 2020-524375

Patent Document 2: Japanese Patent Application Publication No. 2018-152223

SUMMARY OF INVENTION

Technical Problem

For example, when a lead portion is folded back between different battery cells as described in Patent Document 2, lead lines may be connected to individual lead portions to detect a voltage of the lead portion. Unfortunately, connecting lead lines to individual lead portions may become relatively complicated work.

One example of an object of the present invention is to easily detect a voltage of a lead portion folded back between different battery cells. Another object of the present invention will become apparent from the description of the present specification.

Solution to Problem

One aspect of the present invention is a voltage detection device to detect a voltage of a lead portion folded back between different battery cells, and the voltage detection device includes:
a voltage detection portion;
a voltage detection line connected to the voltage detection portion; and a holding body holding the voltage detection portion and the voltage detection line.

Another aspect of the present invention is a battery module including:
a plurality of battery cells; and a voltage detection device to detect a voltage of a lead portion folded back between different battery cells, wherein the voltage detection device includes
a voltage detection portion,
a voltage detection line connected to the voltage detection portion, and
a holding body holding the voltage detection portion and the voltage detection line.

Advantageous Effects of Invention

According to the aspects described above of the present invention, a voltage of a lead portion folded back between different battery cells can be easily detected.

BRIEF DESCRIPTION OF DRAWINGS

FIG. 12 A diagram illustrating the second example of the method of manufacturing a battery module according to the embodiment.

FIG. 13 A diagram illustrating the second example of the method of manufacturing a battery module according to the embodiment.

DESCRIPTION OF EMBODIMENTS

Hereinafter, embodiments and variants of the present invention will be described by using drawings. In all of the drawings, a similar component has a similar reference sign, and description thereof will be appropriately omitted. In the present specification, an ordinal numeral such as "first", "second", and "third" is provided for simply distinguishing a configuration provided with a similar name unless otherwise specified, and does not indicate a specific characteristic (for example, an order or importance) of a configuration.

In the present specification, A and B being substantially equal means not only that A and B are strictly equal, but also means that, for example, A is equal to or more than 90% and equal to or less than 110% of B, or B is equal to or more than 90% and equal to or less than 110% of A.

Figure 1:
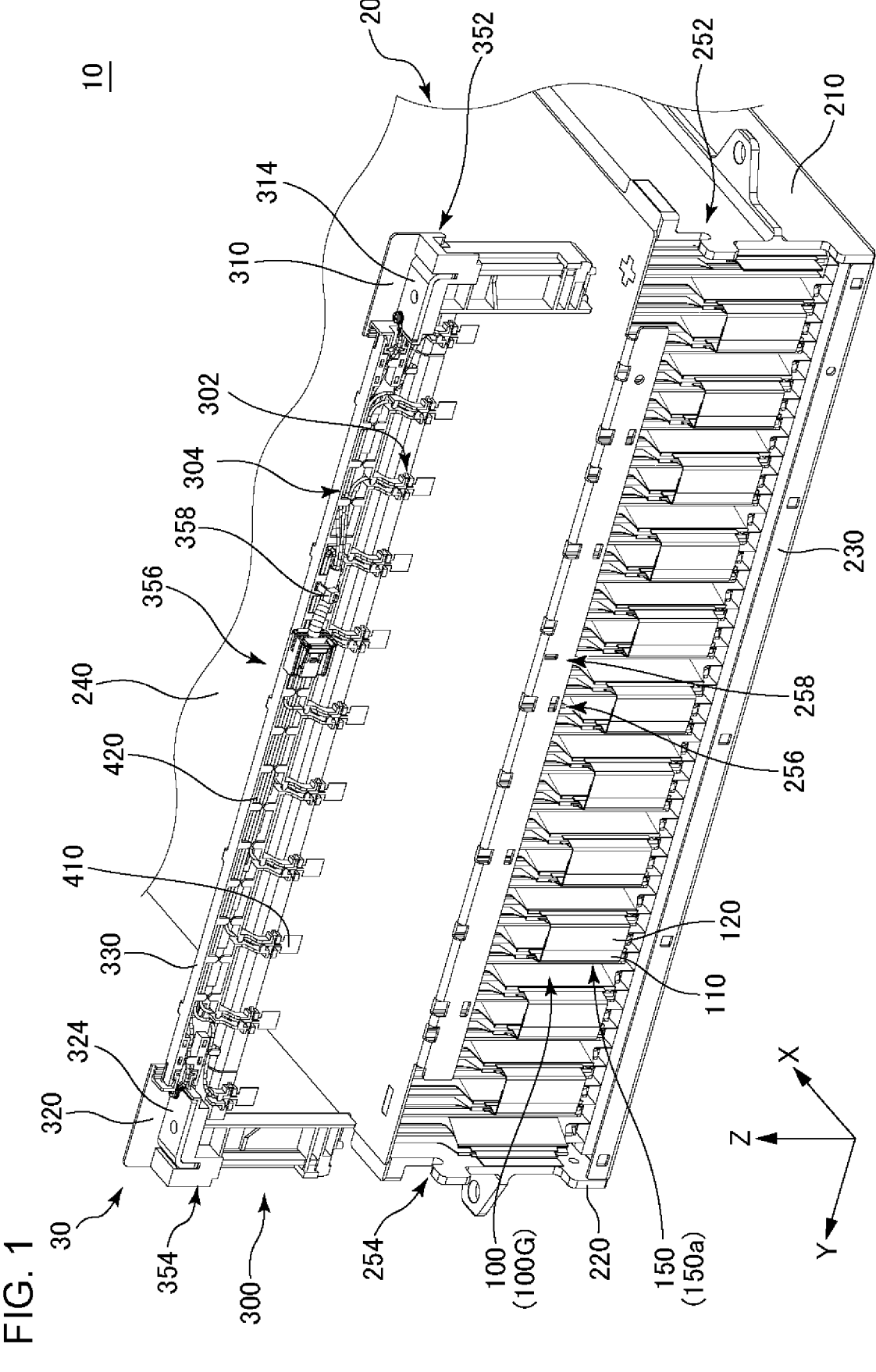
FIG. 1 A front exploded perspective view of a battery module according to an embodiment.

FIG. 1 is a front exploded perspective view of a battery module 10 according to an embodiment.

Figure 2:
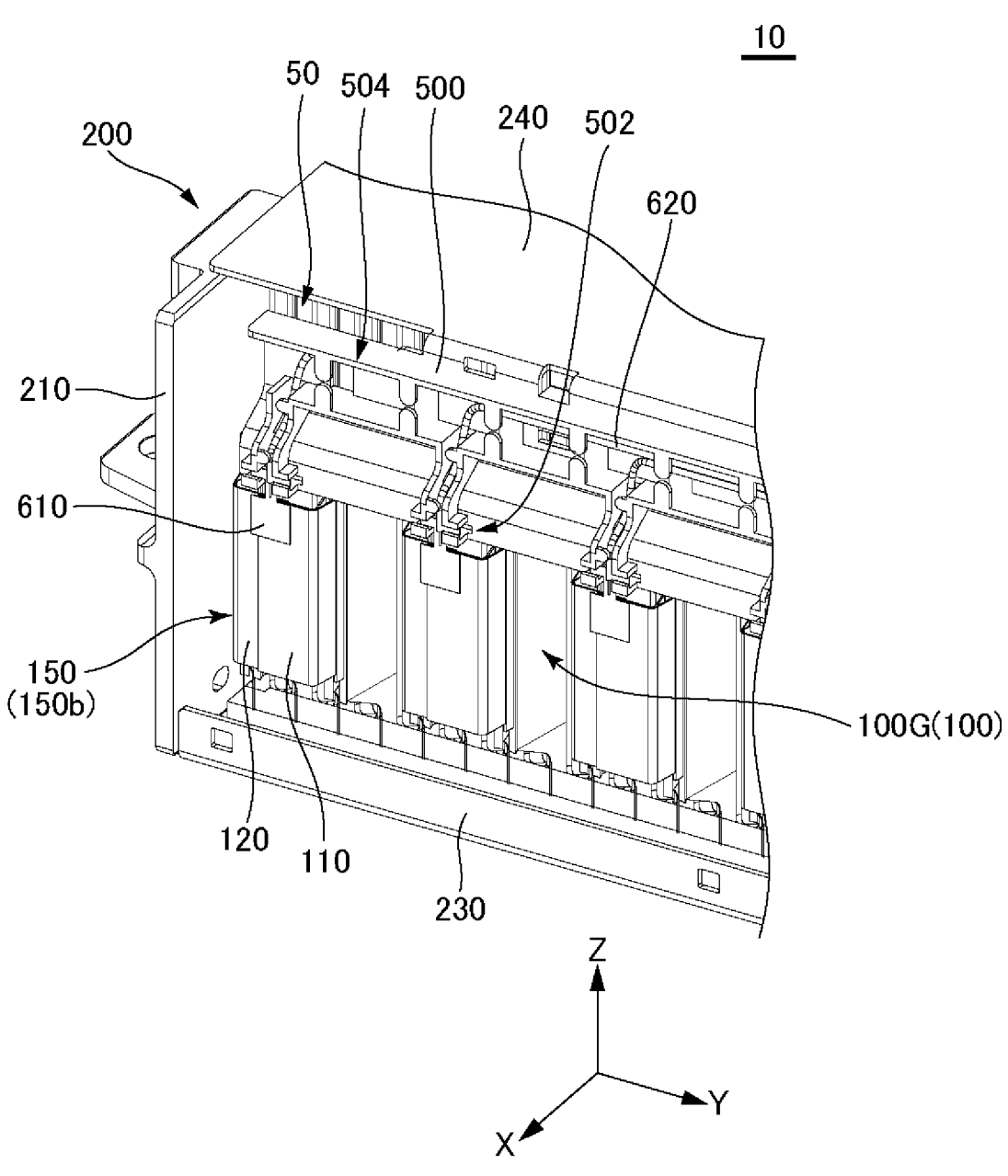
FIG. 2 A rear perspective view of the battery module according to the embodiment.
Figure 3:
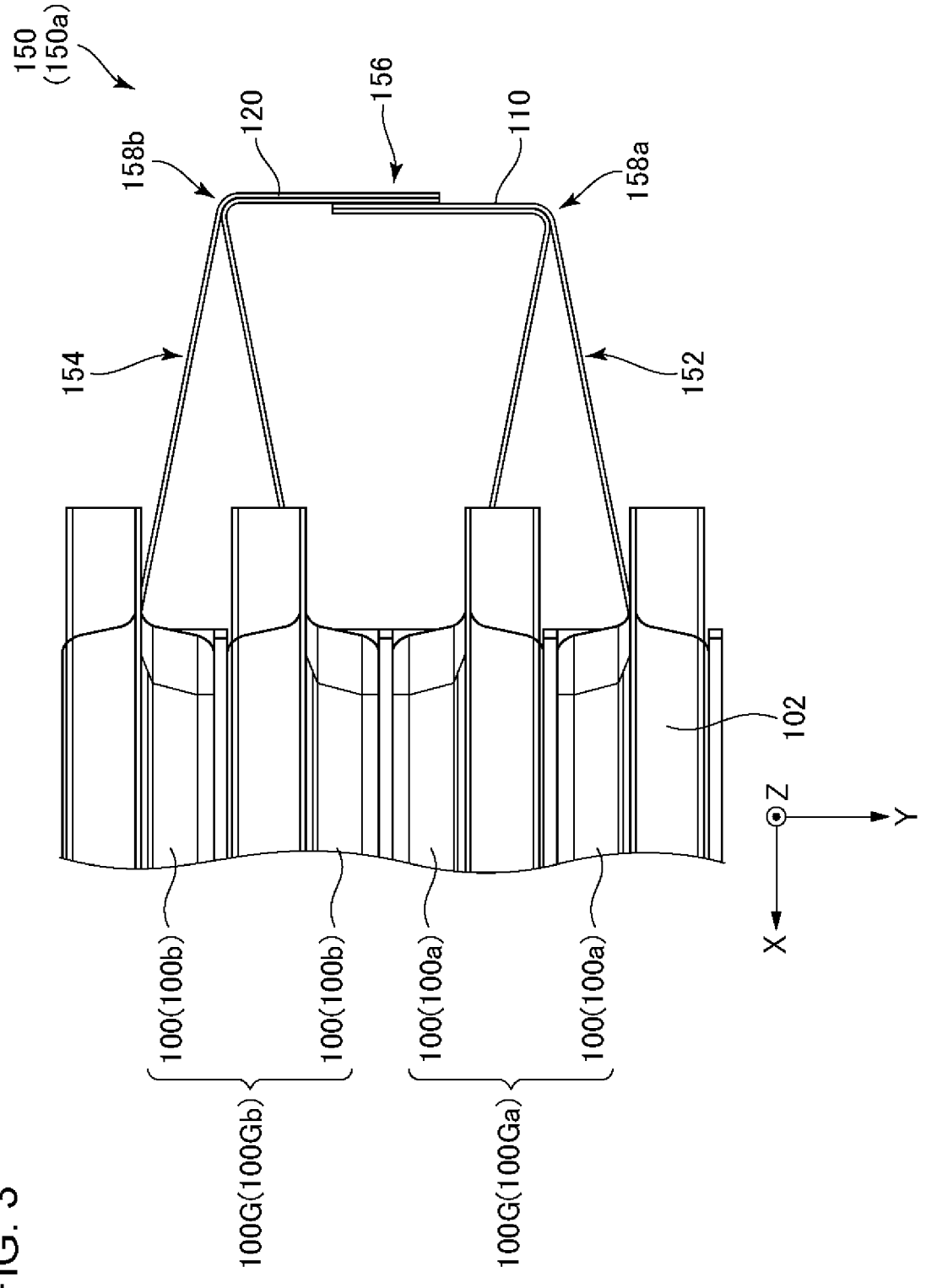
FIG. 3 A side view of a part of a plurality of battery cells according to the embodiment.

FIG. 2 is a rear perspective view of the battery module 10 according to the embodiment. FIG. 3 is a side view of a part of a plurality of battery cells 100 according to the embodiment.

In FIGS. 1 to 3, a first direction X is a direction parallel to a long direction of the battery cell 100. A second direction Y is orthogonal to the first direction X, and is a direction parallel to a thickness direction of the battery cell 100. A third direction Z is orthogonal to both of the first direction X and the second direction Y, and is a direction parallel to a short direction of the battery cell 100. An arrow indicating the first direction X, the second direction Y, or the third direction Z indicates that a direction from a base end to a tip end of the arrow is a positive direction of the direction indicated by the arrow, and a direction from the tip end to the base end of the arrow is a negative direction of the direction indicated by the arrow. A white circle with a black dot indicating the first direction X, the second direction Y, or the third direction Z indicates that a direction from the back to the front of the paper plane is a positive direction of the direction indicated by the white circle with the black dot, and a direction from the front to the back of the paper plane is a negative direction of the direction indicated by the white circle with the black dot. The same applies to subsequent drawings in FIGS. 1 to 3.

In FIGS. 1 to 3, a positive direction of the first direction X is parallel to a direction from the front to the rear of the battery module 10, and a negative direction of the first direction X is a direction from the rear to the front of the battery module 10. A positive direction of the second direction Y is parallel to a direction from the right to the left when viewed from the front of the battery module 10, and a negative direction of the second direction Y is parallel to a direction from the left to the right when viewed from the front of the battery module 10. A positive direction of the third direction Z is parallel to a direction from the bottom to the top in a vertical direction, and a negative direction of the third direction Z is parallel to a direction from the top to the bottom in the vertical direction. A relationship among the first direction X, the second direction Y, the third direction Z, and the vertical direction is not limited to the example described above. The relationship among the first direction X, the second direction Y, the third direction Z, and the vertical direction varies according to an arrangement of the battery module 10. For example, the battery module may be disposed such that the first direction X or the second direction Y is parallel to the vertical direction.

The battery module 10 will be described with reference to FIGS. 1 to 3.

The battery module 10 includes the plurality of battery cells 100, a housing body 200, a first voltage detection device 30, and a second voltage detection device 50. The first voltage detection device 30 includes a first holding body 300, a plurality of first voltage detection portions 410, and a plurality of first voltage detection lines 420. The second voltage detection device 50 includes a second holding body 500, a plurality of second voltage detection portions 610, and a plurality of second voltage detection lines 620.

The plurality of battery cells 100 are stacked in the second direction Y. Each of the battery cells 100 includes an exterior material 102. Each of the battery cells 100 is provided with a positive electrode lead 110 and a negative electrode lead 120.

The exterior material 102 houses a positive electrode, a negative electrode, and a separator not illustrated together with an electrolytic solution not illustrated. In one example, the positive electrode, the negative electrode, and the separator are stacked in the second direction Y inside the exterior material 102. Alternatively, the positive electrode, the negative electrode, and the separator may be wound inside the exterior material 102.

The positive electrode lead 110 is drawn from one end of the exterior material 102 on a positive direction side and a negative direction side of the first direction X. The positive electrode lead 110 is electrically connected to the positive electrode inside the exterior material 102. In one example, the positive electrode lead 110 is formed of a metal such as aluminum.

The negative electrode lead 120 is drawn from the other end of the exterior material 102 on the positive direction side and the negative direction side of the first direction X. The negative electrode lead 120 is electrically connected to the negative electrode inside the exterior material 102. In one example, the negative electrode lead 120 is formed of a metal different from the metal forming the positive electrode lead 110, such as copper.

The plurality of battery cells 100 stacked in the second direction Y include a plurality of cell groups 100G stacked in the second direction Y. Each of the cell groups 100G includes a plurality of parallel-connected battery cells 100 adjacent to each other in the second direction Y. The plurality of cell groups 100G are connected in series from the cell group 100G located at an end portion on a negative direction side of the second direction Y of the plurality of cell groups 100G to the cell group 100G located at an end portion on a positive direction side of the second direction Y of the plurality of cell groups 100G.

Details of the cell group 100G will be described by using FIG. 3. FIG. 3 illustrates an end portion on the negative direction side of the first direction X of a first cell group 100Ga and a second cell group 100Gb of the plurality of cell groups 100G.

The first cell group 100Ga includes a plurality of parallel-connected battery cells 100 adjacent to each other in the second direction Y, i.e., a plurality of first battery cells 100a. The second cell group 100Gb includes a plurality of parallel-connected battery cells 100 adjacent to each other in the second direction Y, i.e., a plurality of second battery cells 100b.

The first cell group 100Ga is provided with a plurality of bundled positive electrode leads 110. The second cell group 100Gb is provided with a plurality of bundled negative electrode leads 120. The plurality of positive electrode leads 110 of the first cell group 100Ga and the plurality of positive electrode leads 110 not illustrated in FIG. 3 of the second cell group 100Gb face opposite sides with respect to the first direction X. The plurality of negative electrode leads 120 not illustrated in FIG. 3 of the first cell group 100Ga and the plurality of negative electrode leads 120 of the second cell group 100Gb face opposite sides with respect to the first direction X.

At least a part, specifically, a tip portion of the plurality of positive electrode leads 110 of the first cell group 100Ga and at least a part, specifically, a tip portion of the plurality of negative electrode leads 120 of the second cell group 100Gb are bonded to each other. The plurality of positive electrode leads 110 of the first cell group 100Ga and the plurality of negative electrode leads 120 of the second cell group 100Gb are folded back from one of the first cell group 100Ga and the second cell group 100Gb to the other of the first cell group 100Ga and the second cell group 100Gb through the at least a part of the plurality of positive electrode leads 110 of the first cell group 100Ga and the at least a part of the plurality of negative electrode leads 120 of the second cell group 100Gb. The first cell group 100Ga and the second cell group 100Gb can be therefore electrically connected to each other without through a conductive member such as a bus bar. In this case, a structure for connecting the first cell group 100Ga and the second cell group 100Gb in series can be simplified as compared to when the conductive member such as the bus bar is used.

A lead portion 150 including the plurality of positive electrode leads 110 of the first cell group 100Ga and the plurality of negative electrode leads 120 of the second cell group 100Gb includes a first region 152, a second region 154, and a third region 156. The lead portion 150 is folded back between the different battery cells 100, specifically, between the first cell group 100Ga and the second cell group 100Gb. The first region 152 is a region where a distance in the second direction Y between the plurality of positive electrode leads 110 of the first cell group 100Ga decreases away from the first cell group 100Ga. The second region 154 is a region where a distance in the second direction Y between the plurality of negative electrode leads 120 of the second cell group 100Gb decreases away from the second cell group 100Gb. The third region 156 is a region between the first region 152 and the second region 154 where the plurality of bundled positive electrode leads 110 of the first cell group 100Ga and the plurality of bundled negative electrode leads 120 of the second cell group 100Gb are bonded to each other.

As illustrated in FIG. 3, lengths of two positive electrode leads 110 located at both ends in the second direction Y of the plurality of positive electrode leads 110 of the first cell group 100Ga from the exterior material 102 to a first bent portion 158a between the first region 152 and the third region 156 are substantially equal. In this case, occurrence of bending of one of the above-described two positive electrode leads 110 can be suppressed as compared to when the above-described lengths of the above-described two positive electrode leads 110 are different from each other. The above-described lengths of the above-described two positive electrode leads 110 may be different from each other.

As illustrated in FIG. 3, lengths of two negative electrode leads 120 located at both ends in the second direction Y of the plurality of negative electrode leads 120 of the second cell group 100Gb from the exterior material 102 to a second bent portion 158b between the second region 154 and the third region 156 are substantially equal. In this case, occurrence of bending of one of the above-described two negative electrode leads 120 can be suppressed as compared to when the above-described lengths of the above-described two negative electrode leads 120 are different from each other. The above-described lengths of the above-described two negative electrode leads 120 may be different from each other.

As illustrated in FIG. 3, the third region 156 between the first bent portion 158a and the second bent portion 158b is flat in parallel with the second direction Y and the third direction Z. In this case, the first voltage detection portion 410 or the second voltage detection portion 610 described below can be easily bonded to the third region 156 as compared to when the third region 156 is non-flat, for example, curved. The third region 156 may be non-flat, for example, curved.

The battery module 10 will be described with reference to FIGS. 1 to 3 again.

As illustrated in FIG. 1, the plurality of negative electrode leads 120 are located on the negative direction side of the first direction X from the plurality of positive electrode leads 110 in a region where the plurality of positive electrode leads 110 and the plurality of negative electrode leads 120 of each lead portion 150 located on the negative direction side of the first direction X of the plurality of cell groups 100G stacked in the second direction Y are bonded to each other. As illustrated in FIG. 2, the plurality of positive electrode leads 110 are located on the positive direction side of the first direction X from the plurality of negative electrode leads 120 in a region where the plurality of positive electrode leads 110 and the plurality of negative electrode leads 120 of each lead portion 150 located on the positive direction side of the first direction X of the plurality of cell groups 100G stacked in the second direction Y are bonded to each other. A structure of each lead portion 150 is not however limited to the examples illustrated in FIGS. 1 and 2.

Hereinafter, each lead portion 150 located on the negative direction side of the first direction X of the plurality of cell groups 100G stacked in the second direction Y is referred to as a first lead portion 150a as necessary. Each lead portion 150 located on the positive direction side of the first direction X of the plurality of cell groups 100G stacked in the second direction Y is referred to as a second lead portion 150b.

The housing body 200 houses the plurality of cell groups 100G stacked in the second direction Y. The housing body 200 includes a first cover member 210, a second cover member 220, a third cover member 230, and a fourth cover member 240. The first cover member 210 covers the negative direction side of the second direction Y of the plurality of cell groups 100G stacked in the second direction Y. The second cover member 220 covers the positive direction side of the second direction Y of the plurality of cell groups 100G stacked in the second direction Y. The third cover member 230 covers the negative direction side of the third direction Z of the plurality of cell groups 100G stacked in the second direction Y. The fourth cover member 240 covers the positive direction side of the third direction Z of the plurality of cell groups 100G stacked in the second direction Y. The housing body 200 includes an unillustrated fifth cover member covering the negative direction side of the first direction X of the plurality of cell groups 100G stacked in the second direction Y and the first holding body 300. The housing body 200 further includes an unillustrated sixth cover member covering the positive direction side of the first direction X of the plurality of cell groups 100G stacked in the second direction Y and the second holding body 500. In the example illustrated in FIG. 1, the fifth cover member is removed. In the example illustrated in FIG. 2, the sixth cover member is removed.

The first holding body 300 is attached to the negative direction side of the first direction X of the housing body 200. The first holding body 300 includes a first attachment body 310, a second attachment body 320, and a third attachment body 330. In the present embodiment, the first attachment body 310 and the second attachment body 320 extend in parallel with the third direction Z. The third attachment body 330 extends in parallel with the second direction Y on a lateral side of the positive direction side of the third direction Z of a plurality of the first lead portions 150*a* between the first attachment body 310 and the second attachment body 320. An end portion of the third attachment body 330 on the negative direction side of the second direction Y is connected to an end portion of the first attachment body 310 on the positive direction side of the third direction Z. An end portion of the third attachment body 330 on the positive direction side of the second direction Y is connected to an end portion of the second attachment body 320 on the positive direction side of the third direction Z.

The first attachment body 310 includes a first alignment portion 352 to enter a first guide portion 252 provided in the first cover member 210. The second attachment body 320 includes a second alignment portion 354 to enter a second guide portion 254 provided in the second cover member 220. Each of the first guide portion 252 and the second guide portion 254 defines a recessed portion open upward. The first alignment portion 352 enters the recessed portion defined by the first guide portion 252 from above the first guide portion 252. The second alignment portion 354 enters the recessed portion defined by the second guide portion 254 from above the second guide portion 254. The first holding body 300 is aligned with the housing body 200 by the first alignment portion 352 and the second alignment portion 354 entering the recessed portion defined by the first guide portion 252 and the recessed portion defined by the second guide portion 254 respectively. The first alignment portion 352 may define a recessed portion for a protruding portion provided on the first guide portion 252 to enter. The second alignment portion 354 may define a recessed portion for a protruding portion provided on the second guide portion 254 to enter.

In the present embodiment, a first bus bar 314 provided on the first attachment body 310 is electrically connected to the positive electrode lead 110 drawn to the negative direction side of the first direction X of the cell group 100G located at the end portion on the negative direction side of the second direction Y of the plurality of cell groups 100G stacked in the second direction Y. The first bus bar 314 is formed of, for example, copper or aluminum. A second bus bar 324 provided on the second attachment body 320 is electrically connected to the negative electrode lead 120 drawn to the negative direction side of the first direction X of the cell group 100G located at the end portion on the positive direction side of the second direction Y of the plurality of cell groups 100G stacked in the second direction Y. The second bus bar 324 is formed of, for example, copper or aluminum.

Specifically, the first bus bar 314 has substantially an L shape when viewed from the first direction X. The first bus bar 314 thus includes a portion extending in the third direction Z and electrically connected to the above-described positive electrode lead 110, and a portion extending from an upper end of the portion extending in the third direction Z to the positive direction of the second direction Y. An upper surface of the portion of the first bus bar 314 extending in the second direction Y is a surface substantially perpendicular to the third direction Z. The portion of the first bus bar 314 extending in the second direction Y is a terminal for connection with an external apparatus. The first bus bar 314 can be thus more easily connected to the external apparatus when the portion of the first bus bar 314 extending in the second direction Y is provided than when the portion of the first bus bar 314 extending in the second direction Y is not provided.

Similarly, the second bus bar 324 has substantially an L shape when viewed from the first direction X. The second bus bar 324 thus includes a portion extending in the third direction Z and electrically connected to the above-described negative electrode lead 120, and a portion extending from an upper end of the portion extending in the third direction Z to the negative direction of the second direction Y. An upper surface of the portion of the second bus bar 324 extending in the second direction Y is a surface substantially perpendicular to the third direction Z. The portion of the second bus bar 324 extending in the second direction Y is a terminal for connection with an external apparatus. The second bus bar 324 can be thus easily connected to the external apparatus when the portion of the second bus bar 324 extending in the second direction Y is provided than when the portion of the second bus bar 324 extending in the second direction Y is not provided.

The tip of the positive electrode lead 110 drawn to the negative direction side of the first direction X of the cell group 100G located at the end portion on the negative direction side of the second direction Y of the plurality of cell groups 100G is not bent in a direction substantially orthogonal to the first direction X and extends in the negative direction of the first direction X. The tip of the positive electrode lead 110 is bonded to a surface on the negative direction side of the second direction Y of the portion of the first bus bar 314 extending in the third direction Z. The tip of the positive electrode lead 110 may be however bonded to a surface on the positive direction side of the second direction Y of the portion of the first bus bar 314 extending in the third direction Z. Similarly, the tip of the negative electrode lead 120 drawn to the negative direction side of the first direction X of the cell group 100G located at the end portion on the positive direction side of the second direction Y of the plurality of cell groups 100G is not bent in the direction substantially orthogonal to the first direction X and extends in the negative direction of the first direction X. The tip of the negative electrode lead 120 is bonded to a surface on the positive direction side of the second direction Y of the portion of the second bus bar 324 extending in the third direction Z. The tip of the negative electrode lead 120 may be however bonded to a surface on the negative direction side of the second direction Y of the portion of the second bus bar 324 extending in the third direction Z. This configuration is preferable because a volume energy density as a portion to house the plurality of cell groups 100G, i.e., a volume energy density as the battery module 10 can be increased without increasing a length dimension of the plurality of cell groups 100G in the second direction Y. A certain number of the stacked cell groups 100G may reverse a direction in the first direction X of the tip of the above-described positive electrode lead 110 and the tip of the above-described negative electrode lead 120.

In a certain total number of the plurality of cell groups 100G stacked in the second direction Y, the negative electrode lead 120 of the cell group 100G located at the end portion on the positive direction side of the second direction Y of the plurality of cell groups 100G stacked in the second direction Y may be drawn to the positive direction side of the first direction X. In this case, the second attachment body 320 may not be provided. Also in this case, the second bus bar 324 provided at a corner on the positive direction side of the first direction X and on the positive direction side of the second direction Y of the housing body 200 may be electrically connected to the negative electrode lead 120 drawn to the positive direction side of the first direction X of the cell group 100G located at the end portion on the positive direction side of the second direction Y of the plurality of cell groups 100G stacked in the second direction Y.

The third attachment body 330 includes a second connection portion 356 mechanically connected to a first connection portion 256 provided on the fourth cover member 240. In the present embodiment, the second connection portion 356 includes a protruding portion to enter a recessed portion defined by the first connection portion 256. The protruding portion provided on the second connection portion 356 is mechanically connected to the recessed portion defined by the first connection portion 256 by snap-fitting, for example. The first holding body 300 is thus attached to the housing body 200. The first holding body 300 can be further firmly fixed to the housing body 200 by inserting a positioning pin 358 attached to the third attachment body 330 into an attachment hole 258 provided in the fourth cover member 240. The second connection portion 356 may define a recessed portion for a protruding portion provided on the first connection portion 256 to enter.

Each of a plurality of the first voltage detection portions 410 is provided for each of the plurality of first lead portions 150a. The first voltage detection device 30 detects a voltage of the plurality of first lead portions 150a by the plurality of first voltage detection portions 410. The first voltage detection portion 410 has a chip shape. Each of the first voltage detection portions 410 is electrically connected to at least one of the plurality of positive electrode leads 110 and the plurality of negative electrode leads 120 in each of the first lead portions 150a. Each of the first voltage detection portions 410 is bonded to the plurality of positive electrode leads 110 and the plurality of negative electrode leads 120 in the first lead portion 150a by laser welding, for example.

The first voltage detection portion 410 is held by the first holding body 300. Specifically, the first holding body 300 includes a first holding portion 302 provided on the third attachment body 330. The first holding portion 302 holds a protrusion provided on an end portion of the first voltage detection portion 410 in the third direction Z. The first voltage detection portion 410 can be accordingly disposed in an appropriate position with respect to the first lead portion 150a with the first holding body 300 attached to the housing body 200. The first voltage detection portion 410 is located on a side of the first lead portion 150a opposite to a side of the first lead portion 150a where the cell group 100G is located with the first holding body 300 attached to the housing body 200. In this case, the first voltage detection portion 410 can be laser-welded to the first lead portion 150a by irradiating the first voltage detection portion 410 with laser from a side opposite to a side where the first lead portion 150a is located. The first voltage detection portion 410 can be therefore easily welded to the first lead portion 150a than when, for example, the first voltage detection portion 410 is located between the first lead portion 150a and the cell group 100G.

The first voltage detection portion 410 is provided on a flat portion of the first lead portion 150a parallel to the second direction Y and the third direction Z. In this case, the first voltage detection portion 410 can be more easily bonded to the first lead portion 150a than when the first voltage detection portion 410 is provided on a non-flat portion such as a bent portion of the first lead portion 150a and when the entire first lead portion 150a is curved.

The first voltage detection portion 410 may be movable in at least one of a direction toward the first lead portion 150a and a direction away from the first lead portion 150a. In this case, the first voltage detection portion 410 can be disposed in an appropriate position in the first direction X with respect to the first lead portion 150a by moving the first voltage detection portion 410 in the first direction X.

In one example, for example, the first voltage detection portion 410 includes the same material as a material included in a portion of the first lead portion 150a in contact with the first voltage detection portion 410, i.e., in the negative electrode lead 120. In this example, the material included in the first voltage detection portion 410 can be more easily bonded to the negative electrode lead 120 than when a material included in the first voltage detection portion 410 is different from a material included in the negative electrode lead 120.

The first voltage detection line 420 is, for example, a wire harness. The first voltage detection line 420 is electrically connected to the first voltage detection portion 410. The first voltage detection line 420 is supported by the first holding body 300. Specifically, the first holding body 300 includes a second holding portion 304 provided on the third attachment body 330. The second holding portion 304 defines a groove for drawing the first voltage detection line 420 along the second direction Y. The second holding portion 304 holds the first voltage detection line 420 by this groove. The first voltage detection line 420 can be therefore drawn along the third attachment body 330 without being physically floated. The first voltage detection line 420 can be thus more stably drawn than when the first voltage detection line 420 is physically floated. The first voltage detection line 420 may be in a physically floated state.

In the present embodiment, the first holding body 300 holds the first voltage detection portion 410 and the first voltage detection line 420. Thus, the first voltage detection portion 410 and the first voltage detection line 420 are integrated. The first voltage detection portion 410 can be disposed in an appropriate position with respect to the first lead portion 150a by attaching the first holding body 300 to the housing body 200. In this case, the first voltage detection portions 410 can be more easily connected to individual first lead portion 150a than when lead lines are connected to individual first lead portions 150a. A voltage of the first lead portion 150a can be therefore more easily detected than when lead lines are connected to individual first lead portions 150a.

The second holding body 500 is attached to the positive direction side of the first direction X of the housing body 200. At least a part of the second holding body 500 extends on a lateral side of the positive direction side of the third direction Z of a plurality of the second lead portions 150b. Similarly to the first holding body 300, the second holding body 500 is mechanically connected to the housing body 200 by snap-fitting, for example.

Each of a plurality of the second voltage detection portions 610 is provided for each of the plurality of second lead portions 150b. The second voltage detection device 50 detects a voltage of the plurality of second lead portions 150b by the plurality of second voltage detection portions 610. The second voltage detection portion 610 has a chip shape. Each of the second voltage detection portions 610 is electrically connected to at least one of the plurality of positive electrode leads 110 and the plurality of negative electrode leads 120 in each of the second lead portions 150b. Each of the second voltage detection portions 610 is bonded to the plurality of positive electrode leads 110 and the plurality of negative electrode leads 120 in the second lead portion 150b by laser welding, for example.

The second voltage detection portion 610 is held by the second holding body 500. Specifically, the second holding body 500 includes a third holding portion 502. The third holding portion 502 holds a protrusion provided on an end portion of the second voltage detection portion 610 in the third direction Z. The second voltage detection portion 610 can be accordingly disposed in an appropriate position with respect to the second lead portion 150*b* with the second holding body 500 attached to the housing body 200. The second voltage detection portion 610 is located on a side of the second lead portion 150*b* opposite to a side of the second lead portion 150*b* where the cell group 100G is located with the second holding body 500 attached to the housing body 200. In this case, the second voltage detection portion 610 can be laser-welded to the second lead portion 150*b* by irradiating the second voltage detection portion 610 with laser from a side opposite to a side where the second lead portion 150*b* is located. The second voltage detection portion 610 can be therefore more easily welded to the second lead portion 150*b* than when, for example, the second voltage detection portion 610 is located between the second lead portion 150*b* and the cell group 100G.

The second voltage detection portion 610 is provided on a flat portion of the second lead portion 150*b* parallel to the second direction Y and the third direction Z. In this case, the second voltage detection portion 610 can be more easily bonded to the second lead portion 150*b* than when the second voltage detection portion 610 is provided on a non-flat portion such as a bent portion of the second lead portion 150*b* and when the entire second lead portion 150*b* is curved.

The second voltage detection portion 610 may be movable in at least one of a direction toward the second lead portion 150*b* and a direction away from the second lead portion 150*b*. In this case, the second voltage detection portion 610 can be disposed in an appropriate position in the first direction X with respect to the second lead portion 150*b* by moving the second voltage detection portion 610 in the first direction X.

In one example, for example, the second voltage detection portion 610 includes the same material as a material included in a portion of the second lead portion 150*b* in contact with the second voltage detection portion 610, i.e., in the positive electrode lead 110. In this example, the material included in the second voltage detection portion 610 can be more easily bonded to the positive electrode lead 110 than when a material included in the second voltage detection portion 610 is different from a material included in the positive electrode lead 110.

The material included in the second voltage detection portion 610 may be the same as the material included in the first voltage detection portion 410. In this case, there is no necessity to use different materials for the first voltage detection portion 410 and the second voltage detection portion 610. When the material included in the second voltage detection portion 610 is the same as the material included in the first voltage detection portion 410, the material included in the second voltage detection portion 610 and the material included in the portion of the second lead portion 150*b* in contact with the second voltage detection portion 610, i.e., in the positive electrode lead 110 may be different. In this case, the plurality of positive electrode leads 110 may be cut in a portion of the second lead portion 150*b* overlapping the second voltage detection portion 610 in the first direction X, and the second voltage detection portion 610 may be laser-welded to the negative electrode lead 120, when it is difficult for the second voltage detection portion 610 to be laser-welded to the positive electrode lead 110 from the positive direction side of the first direction X.

When the material included in the second voltage detection portion 610 is the same as the material included in the first voltage detection portion 410, the plurality of negative electrode leads 120 may be located on the positive direction side of the first direction X from the plurality of positive electrode leads 110 in a region of each second lead portion 150*b* where the plurality of positive electrode leads 110 and the plurality of negative electrode leads 120 are bonded to each other. In this case, the material included in the second voltage detection portion 610 and the material included in the portion of the second lead portion 150*b* in contact with the second voltage detection portion 610, i.e., in the negative electrode lead 120 may be the same. Accordingly, the plurality of positive electrode leads 110 do not need to be cut, and the second voltage detection portion 610 can be easily laser-welded to the negative electrode lead 120 from the positive direction side of the first direction X as compared to when the plurality of positive electrode leads 110 are located on the positive direction side of the first direction X from the plurality of negative electrode leads 120 in the region of each second lead portion 150*b* where the plurality of positive electrode leads 110 and the plurality of negative electrode leads 120 are bonded to each other.

The second voltage detection line 620 is, for example, a wire harness. The second voltage detection line 620 is electrically connected to the second voltage detection portion 610. The second voltage detection line 620 is held by the second holding body 500. Specifically, the second holding body 500 includes a fourth holding portion 504. The fourth holding portion 504 defines a groove for drawing the second voltage detection line 620 along the second direction Y. The fourth holding portion 504 holds the second voltage detection line 620 by this groove. The second voltage detection line 620 can be therefore drawn along the second holding body 500 without being physically floated. The second voltage detection line 620 can be thus more stably drawn than when the second voltage detection line 620 is physically floated. The second voltage detection line 620 may be in a physically floated state.

In the present embodiment, the second holding body 500 holds the second voltage detection portion 610 and the second voltage detection line 620. Thus, the second voltage detection portion 610 and the second voltage detection line 620 are integrated. The second voltage detection portion 610 can be disposed in an appropriate position with respect to the second lead portion 150*b* by attaching the second holding body 500 to the housing body 200. In this case, the second voltage detection portions 610 can be more easily connected to individual second lead portions 150*b* than when lead lines are connected to individual second lead portions 150*b*. A voltage of the second lead portion 150*b* can be therefore more easily detected than when lead lines are connected to individual second lead portions 150*b*.

FIGS. 4 to 8 are diagrams illustrating a first example of a method of manufacturing the battery module 10 according to the embodiment. The battery module 10 is manufactured as follows.

In FIGS. 4 to 8, a positive direction of the second direction Y is parallel to a direction from the bottom to the top in the vertical direction. A negative direction of the second direction Y is parallel to a direction from the top to the bottom in the vertical direction. The first direction X and the third direction Z are parallel to the horizontal direction orthogonal to the vertical direction. The same applies to FIGS. 9 to 10 described below.

Figure 4:
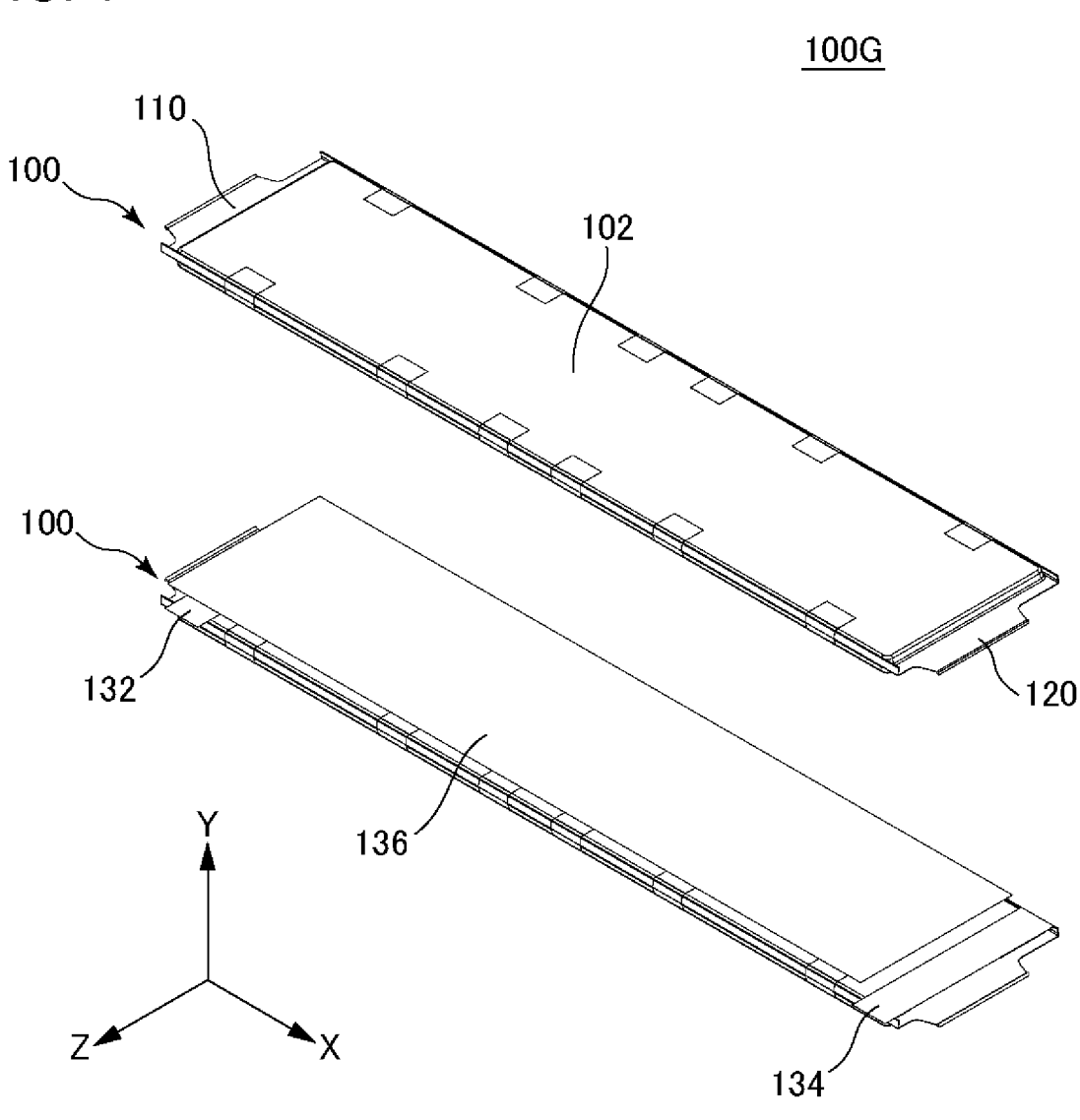
FIG. 4 A diagram illustrating a first example of a method of manufacturing a battery module according to the embodiment.

First, as illustrated in FIG. 4, the cell group 100G including the plurality of battery cells 100 is formed. Specifically, a first tape 132 is provided on the negative direction side of the first direction X of an upper surface of the battery cell 100 located lower of the two battery cells 100. A second tape 134 is provided on the positive direction side of the first direction X of the upper surface of the battery cell 100 located lower of the two battery cells 100. A compression pad 136 is provided through the first tape 132 on the upper surface of the battery cell 100 located lower of the two battery cells 100. Next, the other battery cell 100 is provided through the second tape 134 and the compression pad 136 on the battery cell 100 located lower of the two battery cells 100. The cell group 100G is thus formed. A method of forming the cell group 100G is not limited to the method illustrated in FIG. 4.

Figure 5:
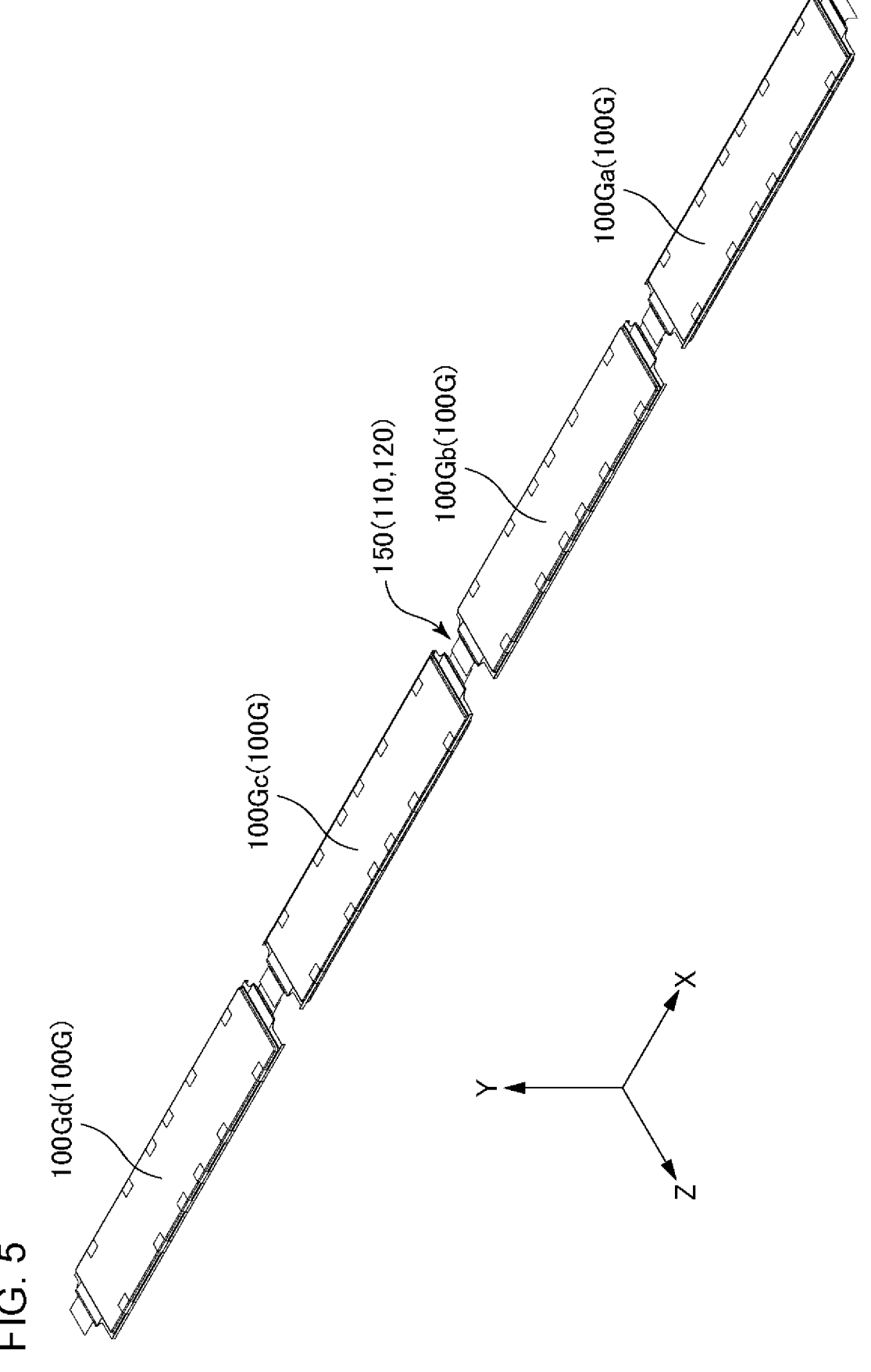
FIG. 5 A diagram illustrating the first example of the method of manufacturing a battery module according to the embodiment.

Next, as illustrated in FIG. 5, the plurality of cell groups 100G are aligned in one line along the first direction such that a thickness direction of each of the cell groups 100G, i.e., the second direction Y is parallel to the vertical direction. The plurality of positive electrode leads 110 of each of the cell groups 100G face the positive direction side of the first direction X. The plurality of negative electrode leads 120 of each of the cell groups 100G face the negative direction side of the first direction X. Furthermore, the plurality of positive electrode leads 110 and the plurality of negative electrode leads 120 overlap each other in the second direction Y such that the plurality of positive electrode leads 110 are located above the plurality of negative electrode leads 120 between the adjacent cell groups 100G. In the example illustrated in FIG. 5, a first cell group 100Ga, a second cell group 100Gb, a third cell group 100Gc, and a fourth cell group 100Gd are aligned in this order from the positive direction to the negative direction of the first direction X. The plurality of cell groups 100G move by a movement mechanism such as a conveyor from the negative direction to the positive direction of the first direction X.

Next, laser is irradiated between the adjacent cell groups 100G from above the plurality of positive electrode leads 110 and the plurality of negative electrode leads 120 to laser-weld at least a part of the plurality of positive electrode leads 110 and at least a part of the plurality of negative electrode leads 120. Thus, at least a part of the plurality of positive electrode leads 110 and at least a part of the plurality of negative electrode leads 120 are bonded to each other. The lead portion 150 including the plurality of positive electrode leads 110 and the plurality of negative electrode leads 120 bonded to each other is thus formed. Time for bonding the plurality of positive electrode leads 110 and the plurality of negative electrode leads 120 can be shorter when laser welding is used than when another method such as ultrasonic bonding is used. The plurality of positive electrode leads 110 and the plurality of negative electrode leads 120 may be bonded by a method different from laser welding, such as ultrasonic bonding.

In one example, laser is wobbly irradiated in laser welding. A size of an intermetallic compound at an interface of different kinds of materials between the positive electrode lead 110 and the negative electrode lead 120 can be more easily adjusted to be minute, and the positive electrode lead 110 and the negative electrode lead 120 can be bonded with higher strength when laser is wobbled than when laser is, for example, linearly irradiated without wobbling. Laser may be, for example, linearly irradiated without wobbling. A size of a gap between the positive electrode lead 110 and the negative electrode lead 120 with the positive electrode lead 110 and the negative electrode lead 120 overlapped each other before the positive electrode lead 110 and the negative electrode lead 120 are welded can be more easily adjusted when the positive electrode lead 110 and the negative electrode lead 120 are welded before the plurality of cell groups 100G are stacked or before the lead portion 150 is bent than when the positive electrode lead 110 and the negative electrode lead 120 are welded after the plurality of cell groups 100G are stacked or after the lead portion 150 is bent. The positive electrode lead 110 and the negative electrode lead 120 may be welded after the plurality of cell groups 100G are stacked or after the lead portion 150 is bent.

Figure 6:
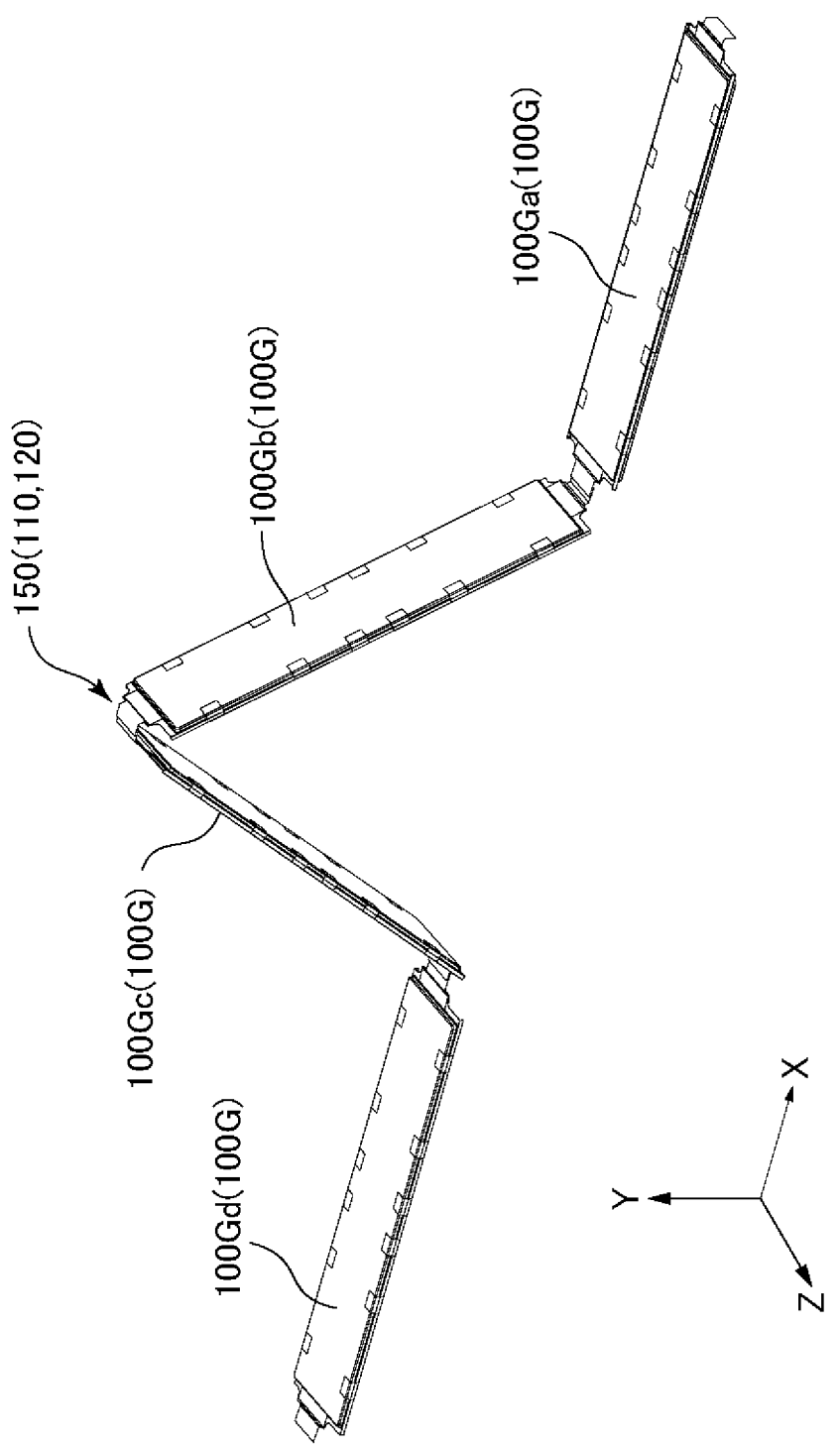
FIG. 6 A diagram illustrating the first example of the method of manufacturing a battery module according to the embodiment.

Next, as illustrated in FIG. 6, the lead portion 150 between the second cell group 100Gb and the third cell group 100Gc is moved upward from the first cell group 100Ga and the fourth cell group 100Gd. The lead portion 150 between the second cell group 100Gb and the third cell group 100Gc is bent to be folded back from one of the second cell group 100Gb and the third cell group 100Gc to the other of the second cell group 100Gb and the third cell group 100Gc.

Figure 7:
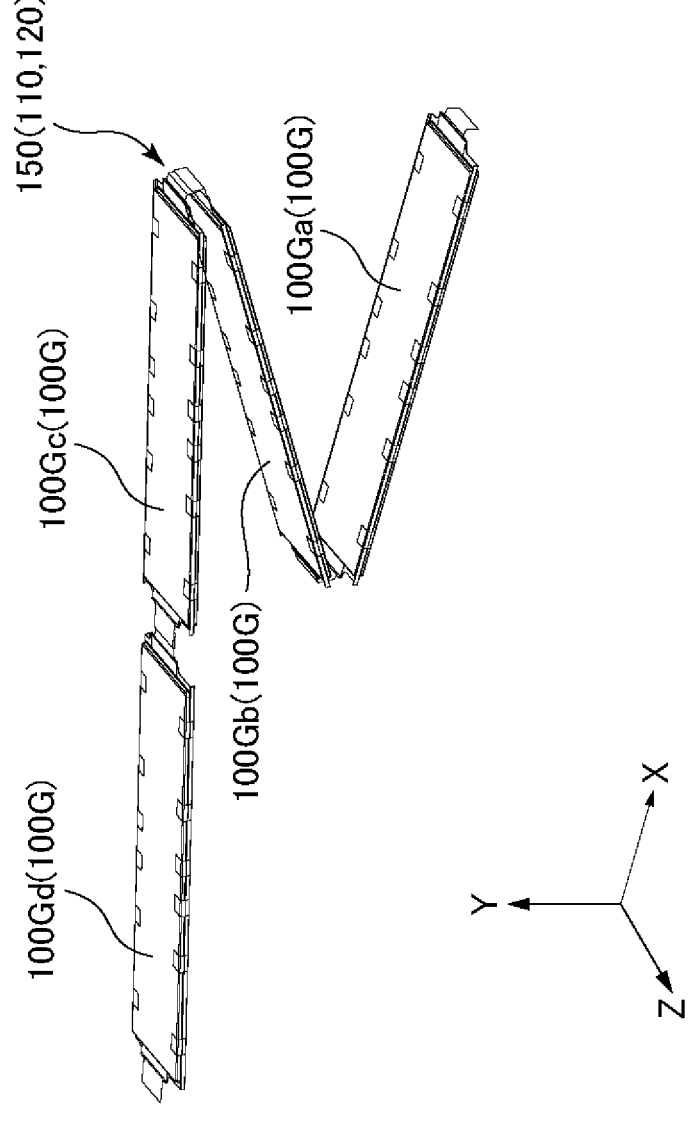
FIG. 7 A diagram illustrating the first example of the method of manufacturing a battery module according to the embodiment.

Next, as illustrated in FIG. 7, the lead portion 150 between the second cell group 100Gb and the third cell group 100Gc is moved toward the positive direction of the first direction X. The lead portion 150 between the first cell group 100Ga and the second cell group 100Gb is bent to be folded back from one of the first cell group 100Ga and the second cell group 100Gb to the other of the first cell group 100Ga and the second cell group 100Gb. Thus, the first cell group 100Ga, the second cell group 100Gb, and the third cell group 100Gc are stacked in the order from the negative direction to the positive direction of the second direction Y.

In the examples illustrated in FIGS. 6 and 7, the lead portion 150 between the cell groups 100G adjacent to each other can be bent by using a clamp, for example. In this case, the third region 156 of the lead portion 150 can be flat as illustrated in FIG. 3 by appropriately adjusting the clamp.

A predetermined number of the cell groups 100G are stacked from the negative direction to the positive direction of the second direction Y by performing the steps illustrated in FIGS. 5 to 7 for an appropriate number of times.

Figure 8:
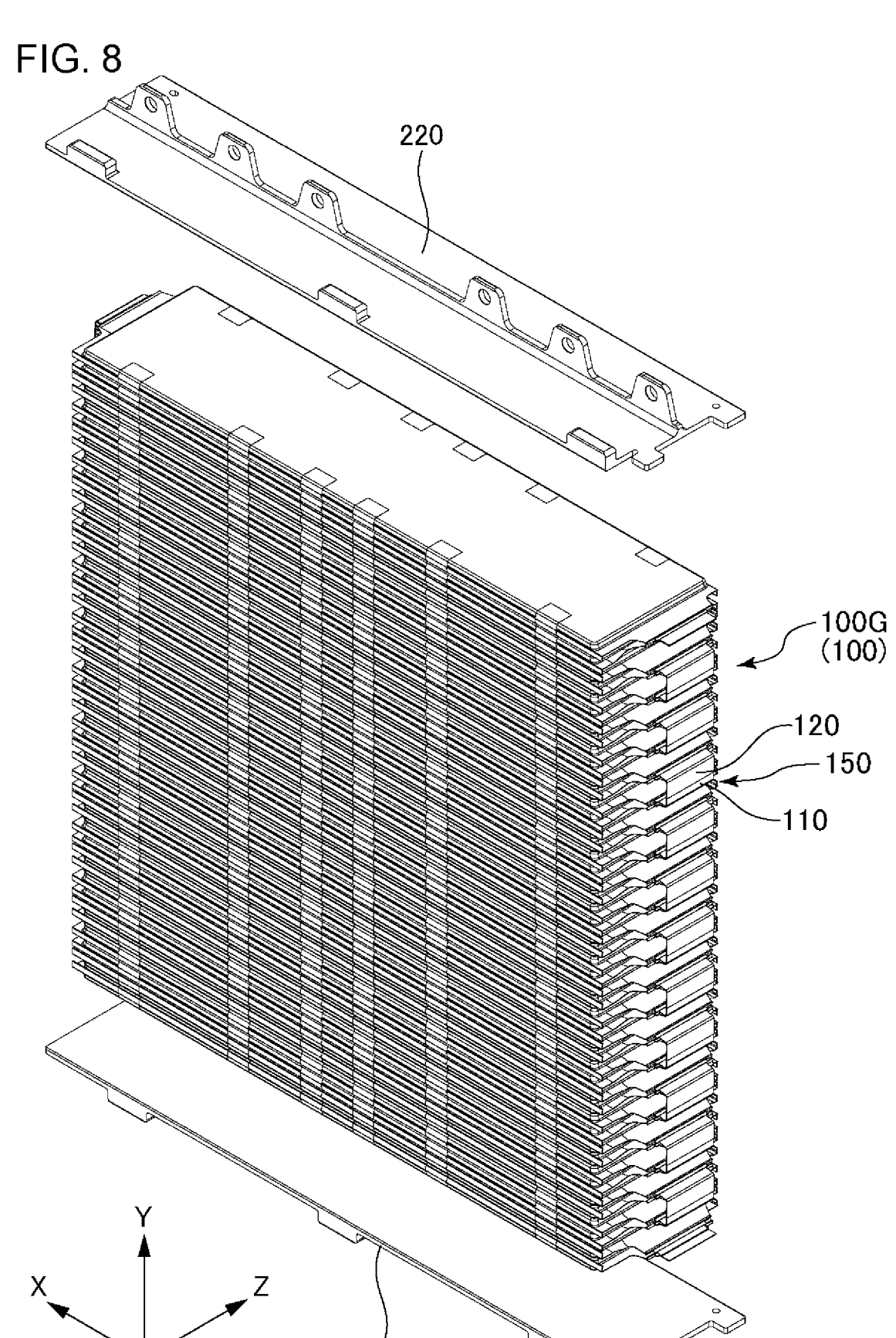
FIG. 8 A diagram illustrating the first example of the method of manufacturing a battery module according to the embodiment.

Next, as illustrated in FIG. 8, the first cover member 210 is provided on the negative direction side of the second direction Y of the plurality of cell groups 100G stacked in the second direction Y, and the second cover member 220 is provided on the positive direction side of the second direction Y of the plurality of cell groups 100G stacked in the second direction Y. Next, the plurality of cell groups 100G stacked in the second direction Y are compressed in the second direction Y by the first cover member 210 and the second cover member 220. Thus, a length in the second direction Y of the plurality of cell groups 100G stacked in the second direction Y is adjusted to a desired length.

Next, the third cover member 230 is provided on the negative direction side of the third direction Z of the plurality of cell groups 100G stacked in the second direction Y. The fourth cover member 240 is provided on the positive direction side of the third direction Z of the cell groups 100G stacked in the second direction Y. Next, the first holding body 300 to which the plurality of first voltage detection portions 410 and the plurality of first voltage detection lines 420 are attached is attached to the housing body 200. The second holding body 500 to which the plurality of second voltage detection portions 610 and the plurality of second voltage detection lines 620 are attached is attached to the housing body 200. Next, each of the first voltage detection portions 410 is bonded to each of the first lead portions 150a by laser welding, for example. Each of the second voltage detection portions 610 is bonded to each of the second lead portions 150*b* by laser welding, for example. Next, the unillustrated fifth cover member is provided on the negative direction side of the first direction X of the plurality of cell groups 100G stacked in the second direction Y. The unillustrated sixth cover member is provided on the positive direction side of the first direction X of the plurality of cell groups 100G stacked in the second direction Y.

Thus, the battery module 10 is manufactured.

Figure 9:
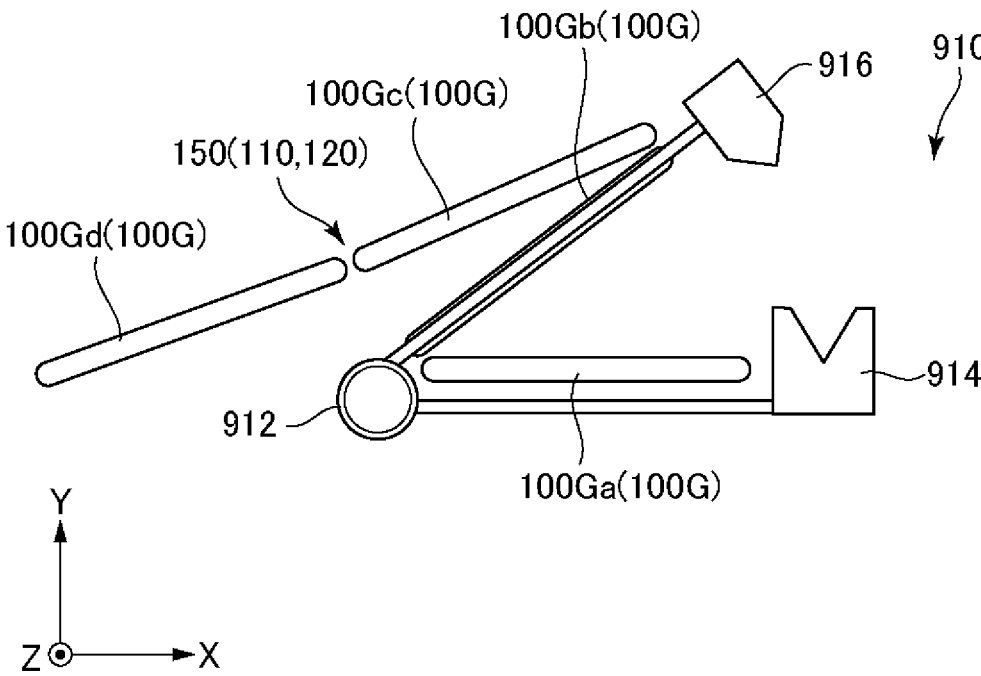
FIG. 9 A diagram illustrating a first example of a method of stacking a plurality of cell groups.

FIG. 9 is a diagram illustrating a first example of a method of stacking the plurality of cell groups 100G.

In the example illustrated in FIG. 9, the first cell group 100Ga, the second cell group 100Gb, and the third cell group 100Gc are stacked by using a first jig 910. The first jig 910 includes a rotating portion 912, a first engagement portion 914, and a second engagement portion 916. The first engagement portion 914 is located on the positive direction side of the first direction X with respect to the rotating portion 912. The second engagement portion 916 is rotatable along a circumference of a circle having a radius of a distance between the rotating portion 912 and the first engagement portion 914 and centering the rotating portion 912. The second engagement portion 916 can be engaged with the first engagement portion 914 from above the first engagement portion 914.

The first cell group 100Ga is fixed between the rotating portion 912 and the first engagement portion 914. The second cell group 100Gb is fixed between the rotating portion 912 and the second engagement portion 916. Rotating the second engagement portion 916 about the rotating portion 912 in this state folds back the lead portion 150 between the first cell group 100Ga and the second cell group 100Gb and folds back the lead portion 150 between the second cell group 100Gb and the third cell group 100Gc. Thus, the first cell group 100Ga, the second cell group 100Gb, and the third cell group 100Gc are stacked in the second direction Y.

The plurality of stacked cell groups 100G can be more easily aligned in the first direction X when the first jig 910 is used than when the first jig 910 is not used.

Figure 10:
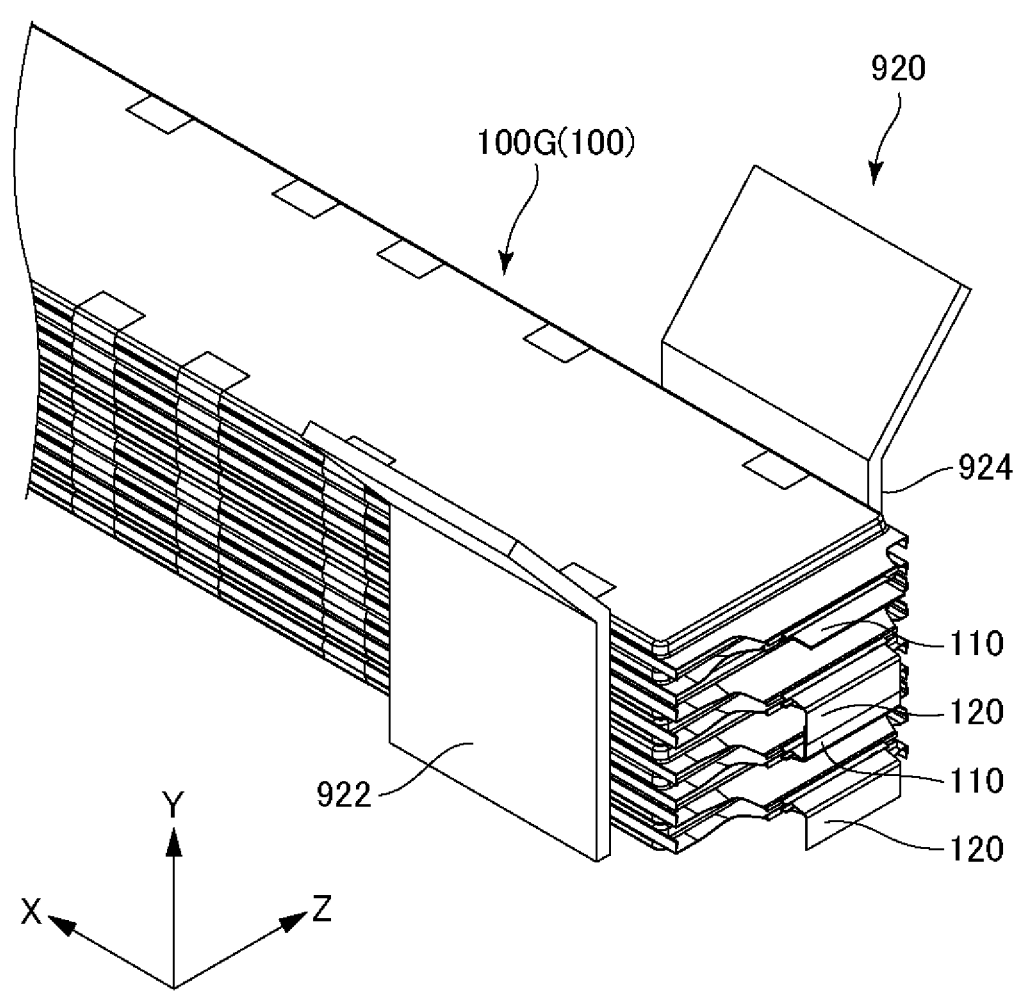
FIG. 10 A diagram illustrating a second example of the method of stacking a plurality of cell groups.

FIG. 10 is a diagram illustrating a second example of the method of stacking the plurality of cell groups 100G.

In the example illustrated in FIG. 10, the plurality of cell groups 100G are stacked in the second direction Y by using a second jig 920. The second jig 920 includes a first guide member 922 and a second guide member 924. The first guide member 922 is provided on the negative direction side of the third direction Z of the plurality of cell groups 100G. The first guide member 922 extends in parallel with the second direction Y. The second guide member 924 is provided on the positive direction side of the third direction Z of the plurality of cell groups 100G. The second guide member 924 extends in parallel with the second direction Y. The plurality of cell groups 100G are therefore stacked along the first guide member 922 and the second guide member 924 between the first guide member 922 and the second guide member 924.

The plurality of stacked cell groups 100G can be more easily aligned in the third direction Z when the second jig 920 is used than when the second jig 920 is not used.

Figure 11:
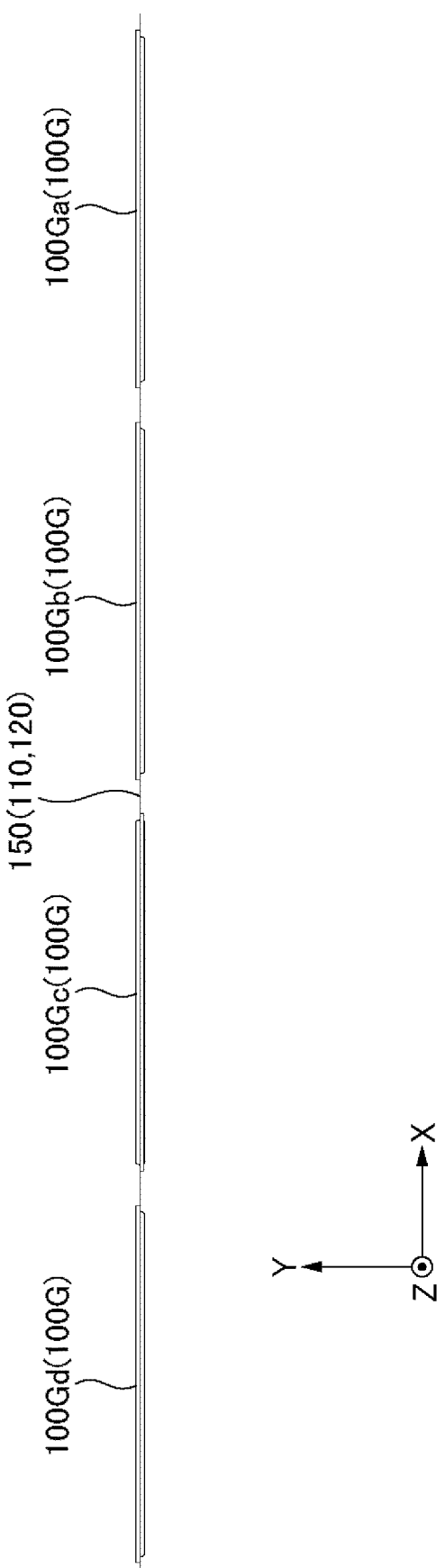
FIG. 11 A diagram illustrating a second example of the method of manufacturing a battery module according to the embodiment.
Figure 12:
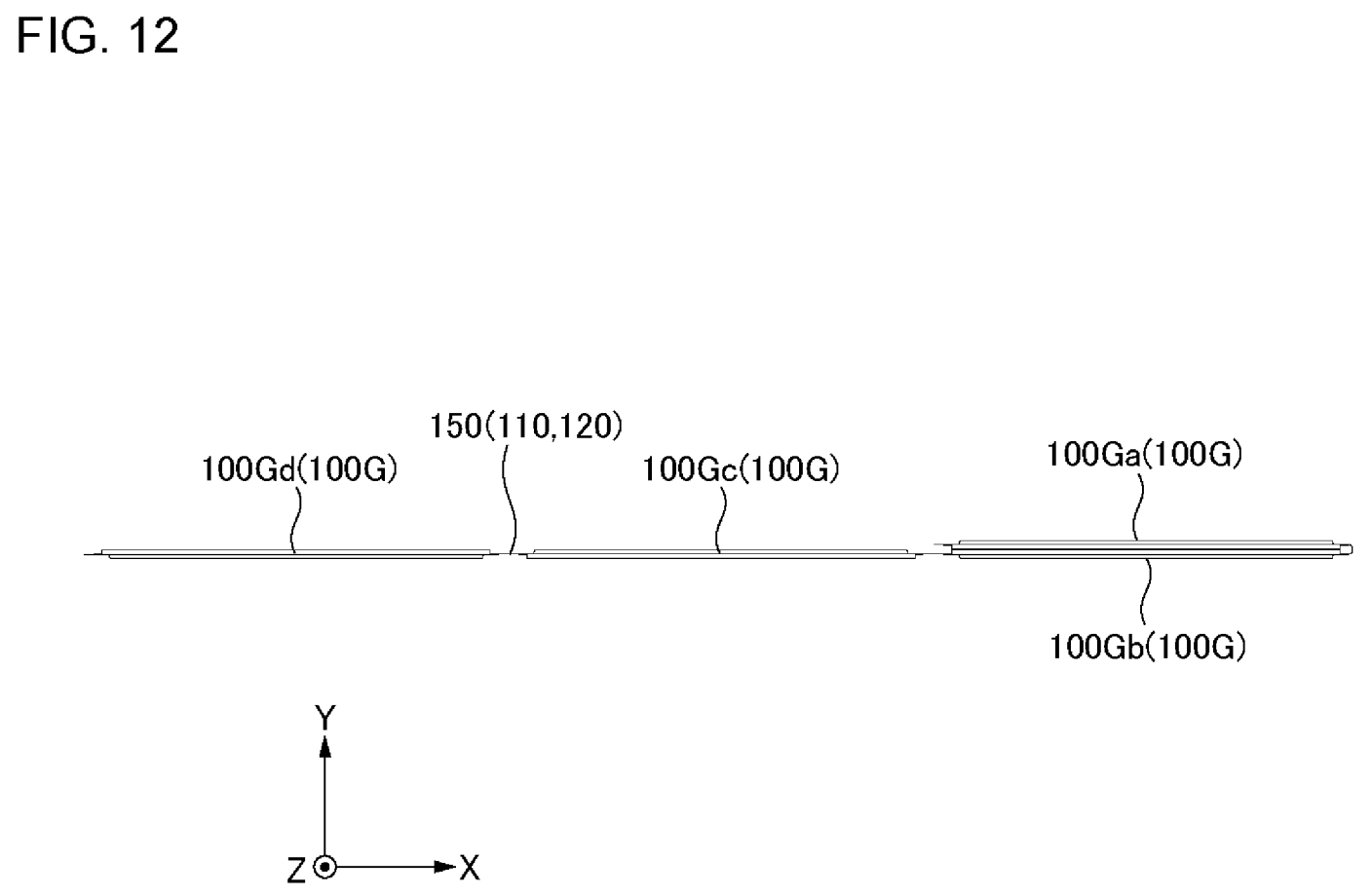
Figure 13:
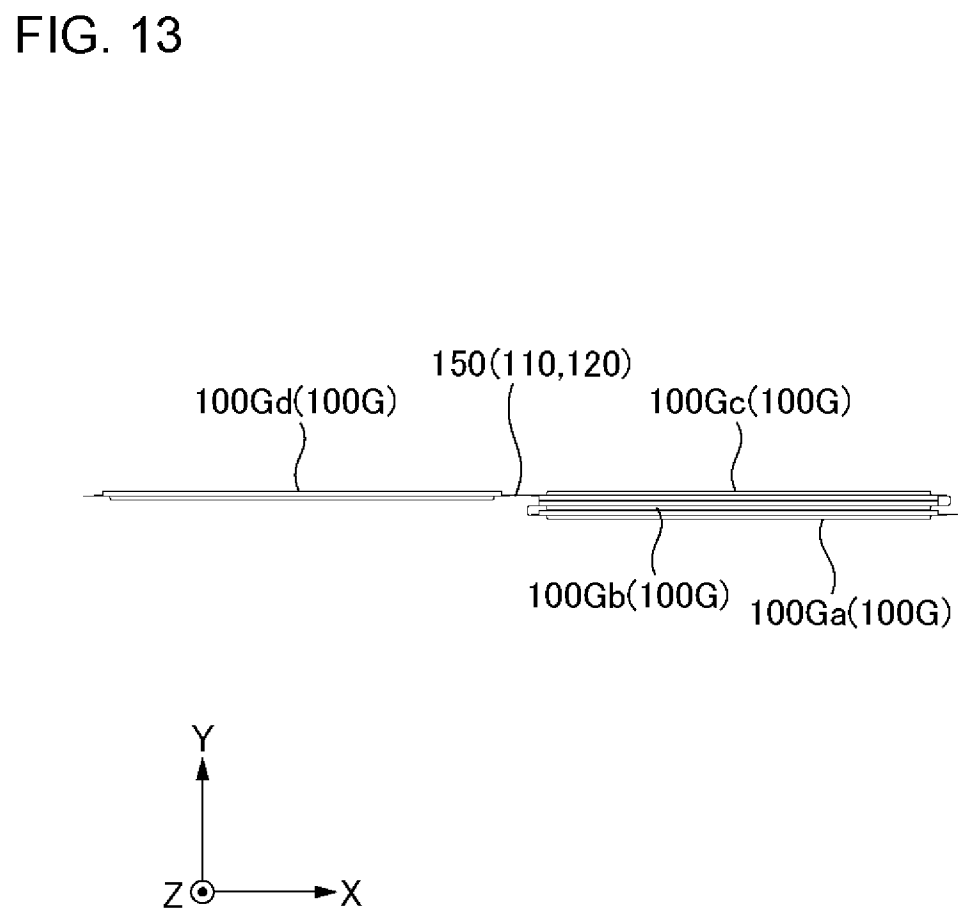

FIGS. 11 to 13 are diagrams illustrating a second example of the method of manufacturing the battery module 10 according to the embodiment. The battery module 10 is manufactured as follows.

In FIGS. 11 to 13, a positive direction of the third direction Z is parallel to the direction from the bottom to the top in the vertical direction. A negative direction of the third direction Z is parallel to the direction from the top to the bottom in the vertical direction. The first direction X and the second direction Y are parallel to the horizontal direction orthogonal to the vertical direction.

First, as illustrated in FIG. 11, the first cell group 100Ga, the second cell group 100Gb, the third cell group 100Gc, and the fourth cell group 100Gd are aligned in one line along the first direction X such that a short direction of each of the cell groups 100G, i.e., the third direction Z is parallel to the vertical direction.

Next, as illustrated in FIG. 12, the lead portion 150 between the first cell group 100Ga and the second cell group 100Gb is folded back to rotate the first cell group 100Ga toward the positive direction side of the second direction Y of the second cell group 100Gb. Thus, the first cell group 100Ga and the second cell group 100Gb are stacked in the second direction Y.

Next, as illustrated in FIG. 13, the lead portion 150 between the second cell group 100Gb and the third cell group 100Gc is folded back to rotate the first cell group 100Ga and the second cell group 100Gb toward the negative direction side of the second direction Y of the third cell group 100Gc. Thus, the first cell group 100Ga, the second cell group 100Gb, and the third cell group 100Gc are stacked in the second direction Y.

In the examples illustrated in FIGS. 11 to 13, each cell group 100G can be aligned in the third direction Z by own weight of each cell group 100G, and the plurality of cell groups 100G can be stacked in the second direction Y.

In the second example illustrated in FIGS. 11 to 13, the four cell groups 100G are bonded in advance in one line along the first direction X in the stage illustrated in FIG. 11. The number of the cell groups 100G bonded in advance is not however limited to this, and may be two, or three or more. For example, the first cell group 100Ga and the second cell group 100Gb may be bonded in one line along the first direction X, the lead portion 150 between the first cell group 100Ga and the second cell group 100Gb may be folded back to stack the first cell group 100Ga and the second cell group 100Gb in the second direction Y, and then the third cell group 100Gc may be bonded to the first cell group 100Ga or the second cell group 100Gb from the positive direction side of the first direction X or the negative direction side of the first direction X. The third cell group 100Gc subsequently stacked in the second direction Y on the first cell group 100Ga and the second cell group 100Gb stacked in the second direction Y can be disposed in any one of the positive direction of the first direction X and the negative direction of the first direction X of the first cell group 100Ga and the second cell group 100Gb stacked in the second direction Y by whether the lead portion 150 folded back between the first cell group 100Ga and the second cell group 100Gb stacked in the second direction Y is located on the positive direction side of the first direction X or the negative direction side of the first direction X. Hereinafter, the cell group 100G stacked in the second direction Y is referred to as a stacked cell group 100G as necessary.

From the matters described above, the cell group 100G subsequently stacked on the stacked cell group 100G can be bonded to the stacked cell group 100G in any time from either one of the positive direction side of the first direction X or the negative direction side of the first direction X of the stacked cell group 100G to stack the cell groups 100G in the second direction Y by whether the cell group 100G subsequently stacked on the stacked cell group 100G is disposed on the positive direction side of the first direction X or the negative direction side of the first direction X of the stacked cell group 100G. Alternatively, each time the subsequent cell group 100G is stacked on the stacked cell group 100G, the cell group 100G can be bonded to the stacked cell group 100G alternately from the positive direction side of the first direction X and the negative direction side of the first direction X of the stacked cell group 100G to stack the cell groups 100G in the second direction Y by whether the cell group 100G subsequently stacked on the stacked cell group 100G is disposed on the positive direction side of the first direction X or the negative direction side of the first direction X of the stacked cell group 100G in the second direction Y.

Figure 14:
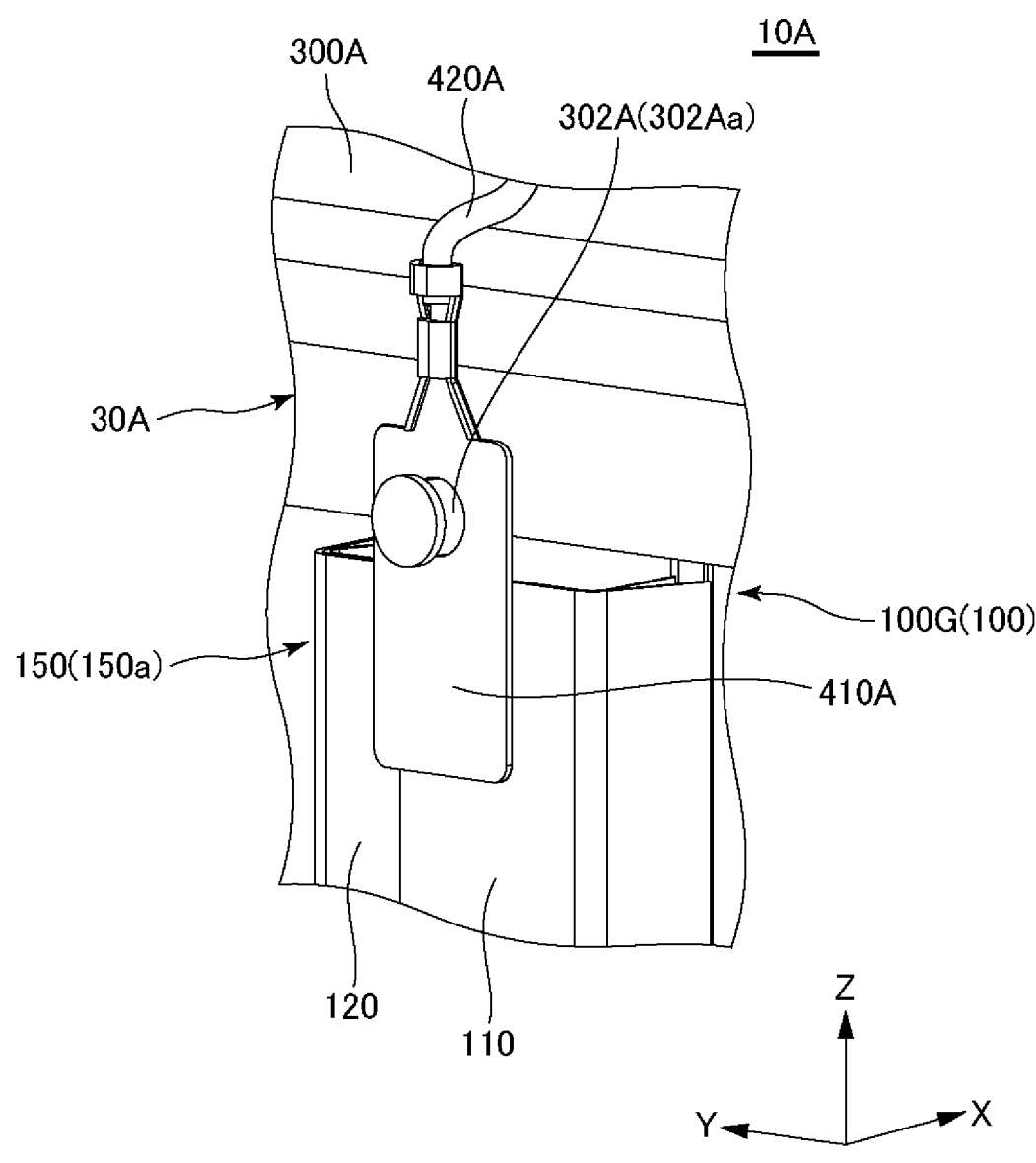
FIG. 14 A front perspective view of a part of a battery module according to a first variant.

FIG. 14 is a front perspective view of a part of a battery module 10A according to a first variant. The battery module 10A according to the first variant is similar to the battery module 10 according to the embodiment except for the following points.

A first holding portion 302A of a first voltage detection device 30A includes a first protruding portion 302Aa provided on the negative direction side of the first direction X of a first holding body 300A. The first protruding portion 302Aa penetrates a first voltage detection portion 410A in the first direction X. The first protruding portion 302Aa is, for example, a pin. The first voltage detection portion 410A is movable in the first direction X along the first protruding portion 302Aa. Thus, the first voltage detection portion 410A is movable in at least one of a direction toward a first lead portion 150a and a direction away from the first lead portion 150a. The first voltage detection portion 410A can be accordingly moved to an appropriate position in the first direction X with respect to the first lead portion 150a when the first voltage detection portion 410A is bonded to the first lead portion 150a.

A width of an end portion of the first protruding portion 302Aa on the negative direction side of the first direction X is wider than a width of a through hole provided in a portion of the first voltage detection portion 410A through which the first protruding portion 302Aa penetrates. The first voltage detection portion 410A is not therefore pulled from the first protruding portion 302Aa.

A first voltage detection line 420A is connected to an end portion of the first voltage detection portion 410A on the positive direction side of the third direction Z. The first voltage detection line 420A is held by the first holding body 300A.

Figure 15:
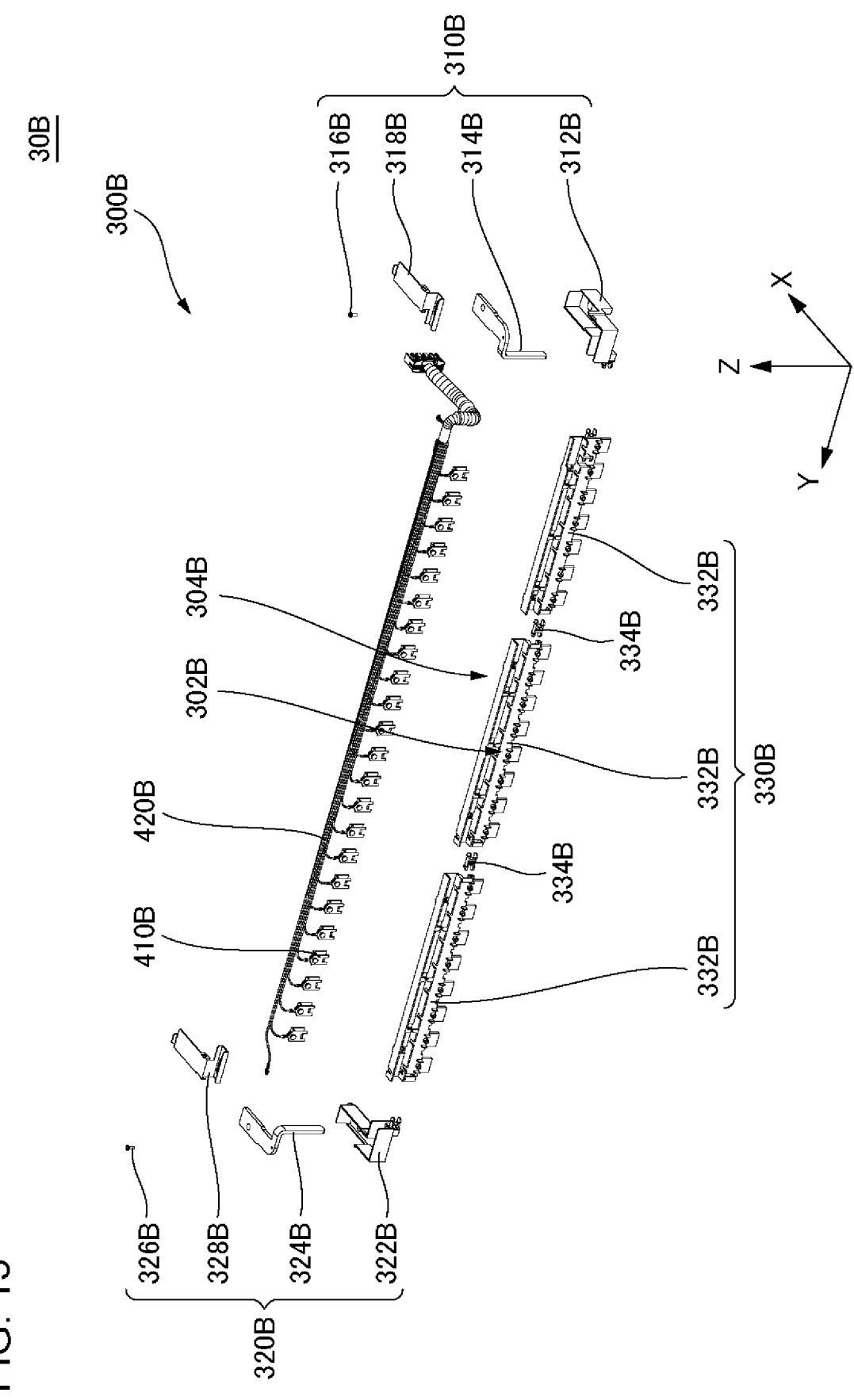
FIG. 15 An exploded perspective view of a first voltage detection device according to a second variant.
Figure 16:
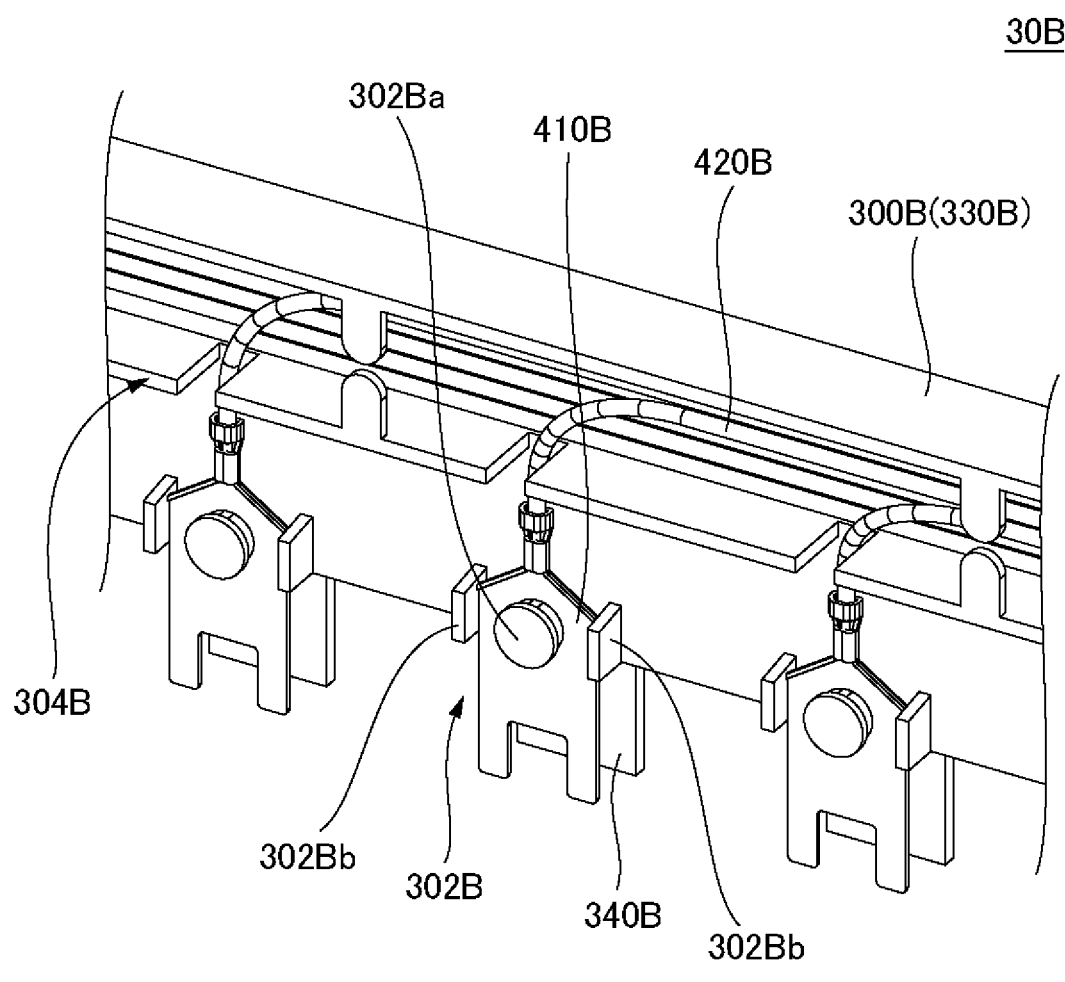
FIG. 16 A front perspective view of a part of the first voltage detection device according to the second variant.

FIG. 15 is an exploded perspective view of a first voltage detection device 30B according to a second variant. FIG. 16 is a front perspective view of a part of the first voltage detection device 30B according to the second variant. The first voltage detection device 30B according to the second variant is similar to the first voltage detection device 30 according to the embodiment except for the following points.

The first voltage detection device 30B includes a first holding body 300B, a plurality of first voltage detection portions 410B, and a plurality of first voltage detection lines 420B. The first holding body 300B includes a first attachment body 310B, a second attachment body 320B, and a third attachment body 330B.

The first attachment body 310B includes a first protector 312B, a first bus bar 314B, a first vis 316B, and a first protector cover 318B. The first voltage detection line 420B is attached to the first bus bar 314B by the first vis 316B. At least a part of the first vis 316B may reach the first protector 312B such that the first vis 316B and the first bus bar 314B can be attached together to the first protector 312B. The first protector cover 318B covers a surface of the first bus bar

314B on the positive direction side of the third direction Z. The first protector cover 318B may cover not only the surface of the first bus bar 314B on the positive direction side of the third direction Z, but also at least a part of the first bus bar 314B on the negative direction side of the second direction Y and at least a part of the first bus bar 314B on the negative direction side of the first direction X.

The second attachment body 320B includes a second protector 322B, a second bus bar 324B, a second vis 326B, and a second protector cover 328B. The first voltage detection line 420B is attached to the second bus bar 324B by the second vis 326B. At least a part of the second vis 326B may reach the second protector 322B such that the second vis 326B and the second bus bar 324B can be attached together to the second protector 322B. The second protector cover 328B covers a surface of the second bus bar 324B on the positive direction side of the third direction Z. The second protector cover 328B may cover not only the surface of the second bus bar 324B on the positive direction side of the third direction Z, but also at least a part of the second bus bar 324B on the positive direction side of the second direction Y and at least a part of the second bus bar 324B on the negative direction side of the first direction X.

The third attachment body 330B can be separated into a plurality of extending bodies 332B along the second direction Y. The adjacent extending bodies 332B are mechanically connected by a connection body 334B. In other words, the third attachment body 330B includes a plurality of portions connected to each other, i.e., the plurality of extending bodies 332B. Each of the plurality of extending bodies 332B includes at least one of, for example, a plurality of first holding portions 302B. In this case, when the first voltage detection device 30B is attached to the housing body 200 as illustrated in FIG. 1, a length of the first voltage detection device 30B in the second direction Y can be adjusted by adjusting the number of the extending bodies 332B included in the third attachment body 330B according to a total number of the plurality of lead portions 150 aligned in the first direction X.

A plurality of wall portions 340B are provided on the third attachment body 330B according to the plurality of first voltage detection portions 410B. When the first voltage detection device 30B is attached to the housing body 200 as illustrated in FIG. 1, the wall portion 340B is located on a side of the first lead portion 150a opposite to a side of the first voltage detection portion 410B is located. When the first lead portion 150a and the first voltage detection portion 410B are laser-welded by irradiating laser from a side of the first voltage detection portion 410B opposite to a side of the first voltage detection portion 410B where the wall portions 340B are located, the arrangement of the wall portions 340B can cause the laser to be irradiated on the wall portions 340B to prevent the laser from being irradiated on a cell group 100G even if the laser passes through the first lead portion 150a. When the first voltage detection device 30B is assembled, transported, and the like with the first voltage detection portion 410B held by the first holding body 302B, the first voltage detection portion 410B can also be prevented from being damaged due to, for example, contact of a jig, a facility, a transport container, a packing material, and the like with the first voltage detection portion 410B from a side of the wall portions 340B opposite to a side of the wall portions 340B where the first voltage detection portion 410B is located.

The first holding portion 302B provided on the third attachment body 330B includes a first protruding portion 302Ba and two second protruding portions 302Bb.

Similarly to the first protruding portion 302Aa according to the first variant, the first protruding portion 302Ba according to the second variant penetrates the first voltage detection portion 410B in the first direction X. Similarly to the first voltage detection portion 410A according to the first variant, the first voltage detection portion 410B according to the second variant is therefore movable in the first direction X along the first protruding portion 302Ba.

The two second protruding portions 302Bb are located on both sides of the second direction Y of the first voltage detection portion 410B. The second protruding portion 302Bb may not be provided on both sides of the second direction Y of the first voltage detection portion 410B, and may be located on only one of the positive direction side and the negative direction side of the second direction Y of the first voltage detection portion 410B. The second protruding portion 302Bb provided on at least one of both sides of the second direction Y of the first voltage detection portion 410B can align the first voltage detection portion 410B in the second direction Y and can prevent rotation of the first voltage detection portion 410B.

A first voltage detection line 420B is connected to an end portion of the first voltage detection portion 410B on the positive direction side of the third direction Z. The first voltage detection line 420B is held by a groove defined by a second holding portion 304B provided on the third attachment body 330B.

While the embodiments and the variants of the present invention have been described with reference to the drawings, the embodiments and the variants are exemplification of the present invention, and various configurations other than the above-described embodiments and variants may also be employed.

For example, in the embodiment, two parallel-connected battery cells 100 are connected in series with two other parallel-connected battery cells 100. Three or more parallel-connected battery cells 100 may be however connected in series with three or more other parallel-connected battery cells 100. The number of the plurality of battery cells 100 and the plurality of other battery cells 100 connected in series may be different from each other such as two parallel-connected battery cells 100 connected in series with three other parallel-connected battery cells 100.

A method of stacking the plurality of cell groups 100G is also not limited to the lamination method according to the embodiment as long as the plurality of cell groups 100G are stacked in the second direction Y such that the lead portion 150 folded back between the cell groups 100G adjacent to each other in the second direction Y is alternately provided in the positive direction of the first direction X and the negative direction of the first direction X.

In the embodiment, the first voltage detection device 30 and the second voltage detection device 50 are used for detecting a voltage of the lead portion 150 including the plurality of positive electrode leads 110 and the plurality of negative electrode leads 120. The first voltage detection device 30 and the second voltage detection device 50 can be however used also for detecting a voltage of the lead portion 150 including a single positive electrode lead 110 and a single negative electrode lead 120.

This application claims priority based on Japanese patent application No. 2021-004740, filed on Jan. 15, 2021, the disclosure of which is incorporated herein in its entirety by reference.

REFERENCE SIGNS LIST

10 Battery module
10A Battery module

30 First voltage detection device
30A First voltage detection device
30B First voltage detection device
50 Second voltage detection device
100 Battery cell
100G Cell group
100Ga First cell group
100Gb Second cell group
100Gc Third cell group
100Gd Fourth cell group
100a First battery cell
100b Second battery cell
102 Exterior material
110 Positive electrode lead
120 Negative electrode lead
132 First tape
134 Second tape
136 Compression pad
150 Lead portion
150a First lead portion
150b Second lead portion
152 First region
154 Second region
156 Third region
158a First bent portion
158b Second bent portion
200 Housing body
210 First cover member
220 Second cover member
230 Third cover member
240 Fourth cover member
252 First guide portion
254 Second guide portion
256 First connection portion
258 Attachment hole
300 First holding body
300A First holding body
300B First holding body
302 First holding portion
302A First holding portion
302Aa First protruding portion
302B First holding portion
302Ba First protruding portion
302Bb Second protruding portion
304 Second holding portion
304B Second holding portion
310 First attachment body
310B First attachment body
312B First protector
314 First bus bar
314B First bus bar
316B First vis
318B First protector cover
320 Second attachment body
320B Second attachment body
322B Second protector
324 Second bus bar
324B Second bus bar
326B Second vis
328B Second protector cover
330 Third attachment body
330B Third attachment body
332B Extending body
334B Connection body
340B Wall portion
352 First alignment portion
354 Second alignment portion

356 Second connection portion
358 Positioning pin
410 First voltage detection portion
410A First voltage detection portion
410B First voltage detection portion
420 First voltage detection line
420A First voltage detection line
420B First voltage detection line
500 Second holding body
502 Third holding portion
504 Fourth holding portion
610 Second voltage detection portion
620 Second voltage detection line
910 First jig
912 Rotating portion
914 First engagement portion
916 Second engagement portion
920 Second jig
922 First guide member
924 Second guide member
X First direction
Y Second direction
Z Third direction

The invention claimed is:

1. A battery module comprising:
a plurality of battery cells;
a lead portion folded back between different battery cells; and
a voltage detection device configured to detect a voltage of the lead portion, wherein
the voltage detection device includes
    a voltage detection portion,
    a voltage detection line connected to the voltage detection portion, and
    a holding body holding the voltage detection portion and the voltage detection line, wherein
the voltage detection portion is a flat shape,
the holding body includes a wall portion which is a flat shape, a plane of the voltage detection portion is parallel to a plane of the wall portion, and
the plane of the voltage detection portion faces the plane of the wall portion in a direction perpendicular to the plane of the voltage detection portion.

2. The battery module according to claim 1, further comprising
a housing body housing the plurality of battery cells, wherein
the holding body includes a connection portion mechanically connected to the housing body.

3. The battery module according to claim 1, wherein
the lead portion is at least partially located between the voltage detection portion and the wall portion.

4. The battery module according to claim 1, wherein
the lead portion is at least partially located between the voltage detection portion and the wall portion in the direction perpendicular to the plane of the voltage detection portion.

5. The battery module according to claim 1, wherein
the plane of the voltage detection portion overlaps the plane of the wall portion in the direction perpendicular to the plane of the voltage detection portion.

6. The battery module according to claim 1, wherein
the holding body includes a first protruding portion penetrating the voltage detection portion, and
the voltage detection portion is movable in the direction perpendicular to the plane of the voltage detection portion along the first protruding portion.

7. The battery module according to claim 1, wherein
the holding body includes a plurality of second protruding portions located on opposite sides of the voltage detection portion in a direction along the plane of the voltage detection portion.

8. The battery module according to claim 1, wherein
the holding body defines a groove, and
the voltage detection line is held by the groove.

* * * * *